(12) United States Patent
Park et al.

(10) Patent No.: US 9,337,207 B2
(45) Date of Patent: May 10, 2016

(54) SEMICONDUCTOR DEVICES INCLUDING WORD LINE INTERCONNECTING STRUCTURES

(71) Applicants: Jintaek Park, Hwaseong-si (KR); Youngwoo Park, Seoul (KR); Jaeduk Lee, Seongnam-si (KR)

(72) Inventors: Jintaek Park, Hwaseong-si (KR); Youngwoo Park, Seoul (KR); Jaeduk Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 122 days.

(21) Appl. No.: 14/191,542

(22) Filed: Feb. 27, 2014

(65) Prior Publication Data

US 2014/0306279 A1    Oct. 16, 2014

(30) Foreign Application Priority Data

Apr. 11, 2013    (KR) .......................... 10-2013-0039902

(51) Int. Cl.
| | |
|---|---|
| *H01L 29/76* | (2006.01) |
| *H01L 27/115* | (2006.01) |
| *H01L 29/788* | (2006.01) |
| *H01L 29/792* | (2006.01) |

(52) U.S. Cl.
CPC .... *H01L 27/11556* (2013.01); *H01L 27/11582* (2013.01); *H01L 29/7889* (2013.01); *H01L 29/7926* (2013.01)

(58) Field of Classification Search
USPC ........................... 257/314, 329, 532; 438/639
See application file for complete search history.

(56) References Cited

U.S. PATENT DOCUMENTS

| | | | |
|---|---|---|---|
| 7,989,880 B2 | 8/2011 | Wada et al. | |
| 8,284,601 B2 | 10/2012 | Son et al. | |
| 8,318,602 B2 | 11/2012 | Kito et al. | |
| 8,363,481 B2 | 1/2013 | Kidoh et al. | |
| 2010/0013049 A1 | 1/2010 | Tanaka et al. | |
| 2011/0065272 A1 | 3/2011 | Mizukami et al. | |
| 2012/0003831 A1 | 1/2012 | Kang et al. | |
| 2012/0068232 A1 | 3/2012 | Kim | |
| 2012/0238093 A1 | 9/2012 | Park et al. | |
| 2013/0075802 A1* | 3/2013 | Chen ................. | H01L 27/11206 257/314 |

FOREIGN PATENT DOCUMENTS

JP    2011-060958 A    3/2011

OTHER PUBLICATIONS

Jang et al. "Vertical Cell Array using TCAT(Terabit Cell Array Transistor) Technology for Ultra High Density NAND Flash Memory", *2009 Symposium on VLSI Technology Digest of Technical Papers*, pp. 192-193, 2009.

* cited by examiner

*Primary Examiner* — Errol Fernandes
(74) *Attorney, Agent, or Firm* — Myers Bigel & Sibley, P.A.

(57) ABSTRACT

A semiconductor memory device includes a substrate including a cell region and an interconnection region, adjacent first and second rows of vertical channels extending vertically from the substrate in the cell region, and layers of word lines stacked on the substrate. Each layer includes a first word line through which the first row of vertical channels passes and a second word line through which the second row of vertical channels passes, and the word lines include respective word line pads extending into the interconnection region. An isolation pattern separates the first and second word lines in the cell region and the interconnection region. First and second pluralities of contact plugs are disposed on opposite sides of the isolation pattern in the interconnection region and contact the word line pads.

12 Claims, 34 Drawing Sheets

SEMICONDUCTOR DEVICES INCLUDING WORD LINE INTERCONNECTING STRUCTURES

CROSS-REFERENCE TO RELATED APPLICATION

This U.S. non-provisional patent application claims priority under 35 U.S.C. §119 to Korean Patent Application No. 10-2013-0039902, filed on Apr. 11, 2013, in the Korean Intellectual Property Office, the disclosure of which is hereby incorporated by reference in its entirety.

BACKGROUND

The inventive subject matter relate to semiconductor devices and manufacturing methods thereof and, more particularly, to three-dimensional semiconductor memory devices and methods of fabricating the same.

Semiconductor devices are becoming more highly integrated in order to provide high performance and low cost. The integration density of semiconductor devices is a factor that may influence the cost of semiconductor devices. An integration degree of a conventional two-dimensional (2D) memory device may be determined by an area that a unit memory cell occupies. Therefore, the integration density of the conventional 2D memory device may be greatly affected by the level of a fine pattern formation technique. However, high-priced equipment may be needed to form fine patterns, thus potentially limiting the integration density of 2D memory devices.

Semiconductor devices including three-dimensionally arranged memory cells (i.e., three-dimensional (3D) memory devices) have been proposed to overcome the above limitations. In 3D memory devices, interconnections (e.g., word lines and bit lines) among cells may be three-dimensionally arranged.

SUMMARY

Embodiments of the inventive subject matter may provide semiconductor devices including interconnecting structures for electrically connecting vertically stacked word lines to peripheral circuits.

Some embodiments provide a semiconductor memory device including a substrate including a cell region and an interconnection region, adjacent first and second rows of vertical channels extending vertically from the substrate in the cell region, and layers of word lines stacked on the substrate. Each layer includes a first word line through which the first row of vertical channels passes and a second word line through which the second row of vertical channels passes, and the word lines include respective word line pads extending into the interconnection region. An isolation pattern separates the first and second word lines in the cell region and the interconnection region. First and second pluralities of contact plugs are disposed on opposite sides of the isolation pattern in the interconnection region and contact the word line pads.

The device may further include respective first and second string selection lines disposed on respective ones of the first word lines and the second word lines. The device may also include respective ground selection lines underlying the first and second word lines.

In some embodiments, sidewalls of the word line pads may be substantially vertically aligned with each other. Heights of the bottom surfaces of the plugs may increase with distance from the cell region. A height difference between adjacent ones of the plugs adjacent may be substantially equal to a height difference between the word line pads connected thereto.

The plugs may include the same conductive material layer as the word lines. Each of the plugs may include at least one conductive layer and an insulating spacer. Each insulating spacer may separate the associated plug from at least one of the word line pads. A thickness of the word lines may be less than a width of the plugs. The plugs may include two or more conductive layers including respective different materials.

Some embodiments provide a semiconductor memory device including a substrate including a cell region and an interconnection region, adjacent first and second rows of vertical channels extending vertically from the substrate in the cell region, and a stack of word lines on the substrate in the cell region and having the first and second rows of vertical channels passing therethrough, the word lines including respective word line pads extending into the interconnection region. First and second string selection lines are disposed adjacent one another on the stack of word lines and have respective ones of the first and second rows of vertical channels passing therethrough. A row of first contact plugs is disposed in the interconnection region and contacts the word line pads. Respective second contact plugs are disposed in the interconnection region and contact respective ones of the first and second string selection lines. The device may further include an isolation region abutting sidewalls of the stack of word lines and extending through the cell region and the interconnection region.

Still further embodiments provide methods including forming a stack of alternating insulating layers and sacrificial layers on a substrate having a cell region and an interconnection region, forming first and second rows of vertical channels penetrating the stack in the cell region, forming first and second rows of contact holes penetrating the stack in the interconnection region, forming respective insulating spacers on sidewalls of respective ones of the contact holes, selectively removing portions of the sacrificial layers, forming conductive regions in spaces formed by removal of the portions of the sacrificial layers, and forming a trench extending between the first and second rows of vertical channels in the cell region and between the first and second rows of contact holes to form layers of word lines stacked on the substrate. Each layer of word lines includes a first word line surrounding the first row of vertical channels and a second word line surrounding the second row of vertical channels. The methods may further include filling the trench with an insulating layer to form an isolation pattern.

BRIEF DESCRIPTION OF THE DRAWINGS

The inventive subject matter will become more apparent in view of the attached drawings and accompanying detailed description.

FIGS. 3A to 8A are plan views illustrating operations for manufacturing a semiconductor device according to some embodiments of the inventive subject matter;

FIGS. 3B to 8B are cross-sectional views taken along lines I-I' and II-II' of FIGS. 3A to 8A, respectively;

DETAILED DESCRIPTION

Figure 1:
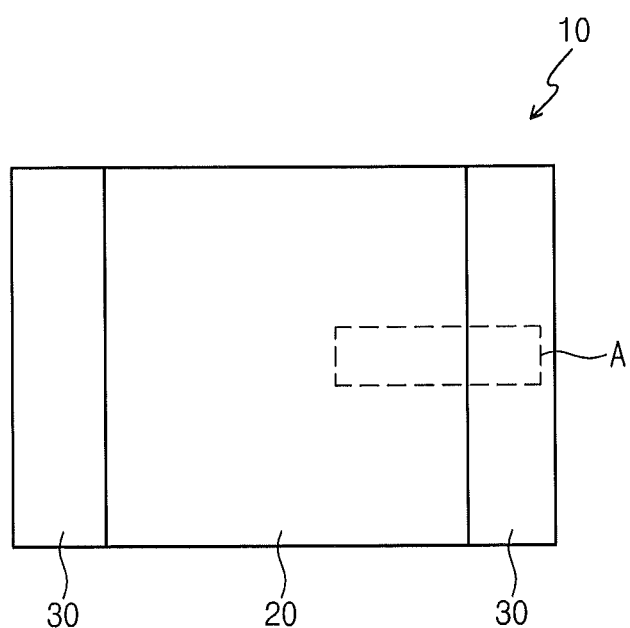
FIG. 1 is a plan view of a semiconductor device according to example embodiments of the inventive subject matter.

The inventive subject matter will now be described more fully hereinafter with reference to the accompanying drawings, in which exemplary embodiments of the inventive subject matter are shown. The advantages and features of the inventive subject matter and methods of achieving them will be apparent from the following exemplary embodiments that will be described in more detail with reference to the accompanying drawings. It should be noted, however, that the inventive subject matter is not limited to the following exemplary embodiments, and may be implemented in various forms. Accordingly, the exemplary embodiments are provided only to disclose the inventive subject matter and let those skilled in the art know the category of the inventive subject matter. In the drawings, embodiments of the inventive subject matter is not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, embodiments in the detailed description will be described with sectional views as ideal exemplary views of the inventive subject matter. Accordingly, shapes of the exemplary views may be modified according to manufacturing techniques and/or allowable errors. Therefore, embodiments of the inventive subject matter is not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive subject matter.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive subject matter explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

FIG. 1 is a plan view illustrating arrangement of a memory cell region and an interconnection region of a semiconductor device according to example embodiments of the inventive subject matter.

Referring to FIG. 1, a semiconductor device may include a memory cell array 10 including memory cells and a peripheral circuit including functional circuits for operating the memory cells. The peripheral circuit may be disposed around the memory cell array 10. The memory cell array 10 may include a memory cell region 20 and at least one interconnection region 30 disposed adjacent the memory cell region 20. The memory cell region 20 may be a region in which three-dimensionally arranged memory cells are disposed, and the interconnection region 30 may be a region in which structures for connecting the memory cells to the functional circuits are disposed.

According to some embodiments of the inventive subject matter, the interconnection region 30 may be disposed at a side or both sides of the memory cell region 20.

The interconnection region 30 may be used for electrical connection between different interconnections from each other. For example, the structures of the interconnection region 30 may be provided in order to connect at least one of words lines, bit lines and source lines used for selecting the memory cells to the functional circuits.

Figure 2:
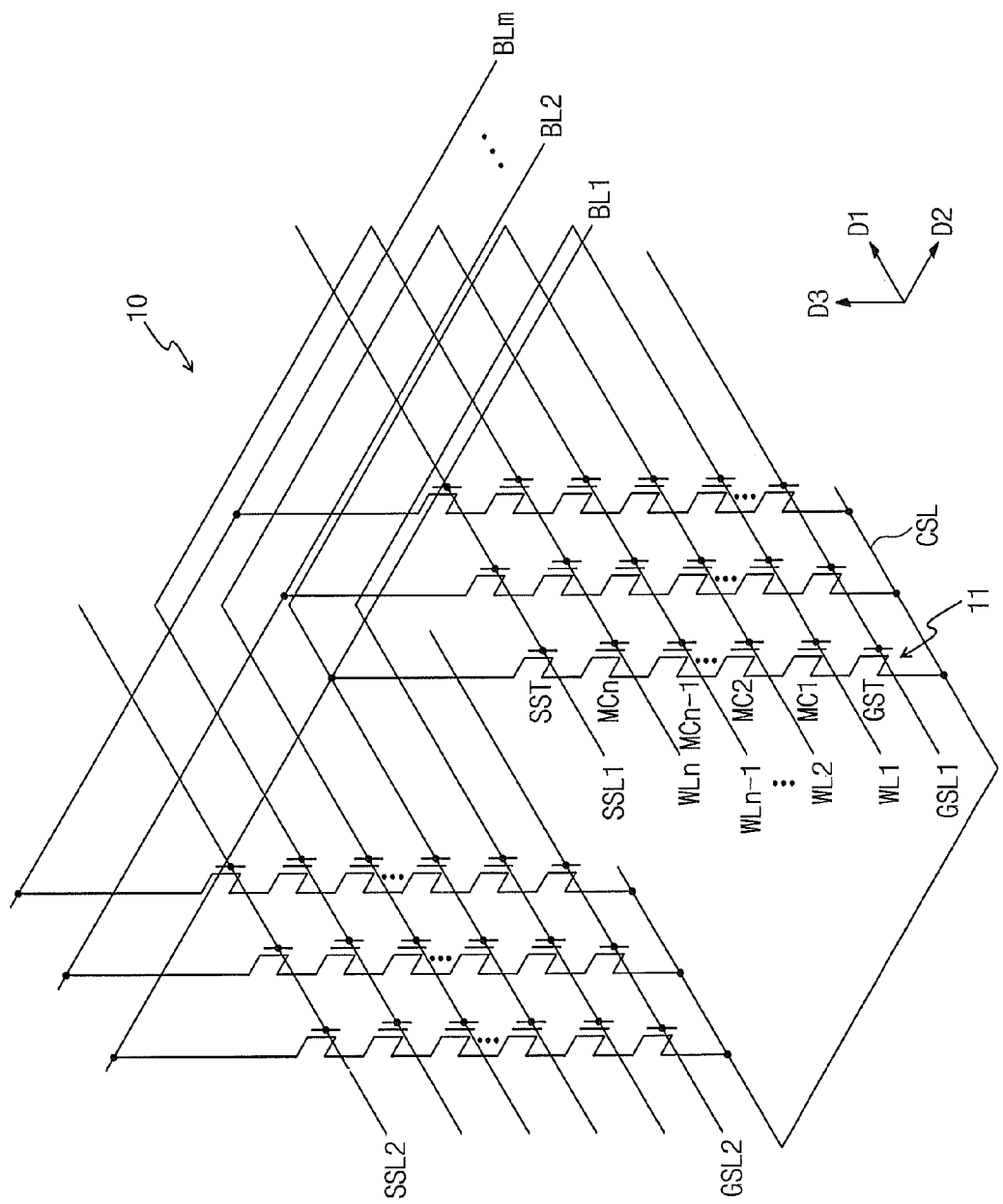
FIG. 2 is an equivalent circuit diagram of a memory cell array of a semiconductor device according to example embodiments of the inventive subject matter.

FIG. 2 is an equivalent circuit diagram of a memory cell array of a semiconductor device according to example embodiments of the inventive subject matter. FIG. 2 illustrates an equivalent circuit diagram of a NAND flash memory device including a vertical structure having a vertical channel structure as an example.

Referring to FIG. 2, the memory cell array 10 may include a plurality of memory cell strings 11. The memory cell array 10 may include a plurality of bit lines BL1, BL2, . . . , BLm−1, and BLm, a plurality of word lines WL1, WL2, . . . , WLn−1, and WLn, string selection lines SSL1 and SSL2, ground selection lines GSL1 and GSL2, and a common source line CSL. The plurality of cell strings 11 are formed between the common source line CSL and the bit lines BL1, BL2, . . . , BLm−1, and BLm.

Each of the cell strings 11 may include a string selection transistor SST, a ground selection transistor GST, and a plurality of memory cell transistors MC1, MC2, . . . , MCn−1, and MCn. A drain region of the string selection transistor SST may be connected to one of the bit lines BL1, BL2, . . . , BLm−1, and BLm. The common source line CSL are connected in common to source regions of the ground selection transistors GST.

The string selection transistors SST may be connected to the string selection lines SSL1 and SSL2, and the ground selection transistors GST may be connected to the ground selection lines GSL1 and GSL2. The memory cell transistors MC1, MC2, . . . , MCn−1, and MCn may be connected to the word lines WL1, WL2, . . . , WLn−1, and WLn, respectively.

The memory cell array 10 has a three-dimensional structure. The memory cell transistors MC1, MC2, . . . , MCn−1, and MCn of each cell string 11 may be connected in series to each other along a D3-axis vertical to a D1-D2 plane parallel to a top surface of a substrate (not shown). Thus, channel regions of the string and ground transistors SST and GST and the memory cell transistors MC1, MC2, . . . , MCn−1, and MCn may be formed to be substantially vertical to the D1-D2 plane. In each D1-D2 plane, m memory cell transistors may be arranged along a D1-axis, and n D1-D2 planes may be stacked on the substrate along the D3-axis. Thus, the number of the bit lines BL1, BL2, . . . , BLm−1, and BLm respectively connected to the cell strings may be m, and the number of the word lines WL1, WL2, . . . , WLn−1, and WLn respectively connected to the stacked memory cell transistors may be n.

FIGS. 3A to 8A are plan views illustrating operations for manufacturing a semiconductor device according to some embodiments of the inventive subject matter. FIGS. 3A to 8A are enlarged views of a portion 'A' of FIG. 1. FIGS. 3B to 8B are cross-sectional views taken along lines I-I' and II-II' of FIGS. 3A to 8A, respectively. FIGS. 9, 10, and 13 to 16 are cross-sectional views corresponding to lines I-I' and II-II' of FIG. 8A to illustrate operations for manufacturing a semiconductor device according to some embodiments of the inventive subject matter.

Figure 3A:
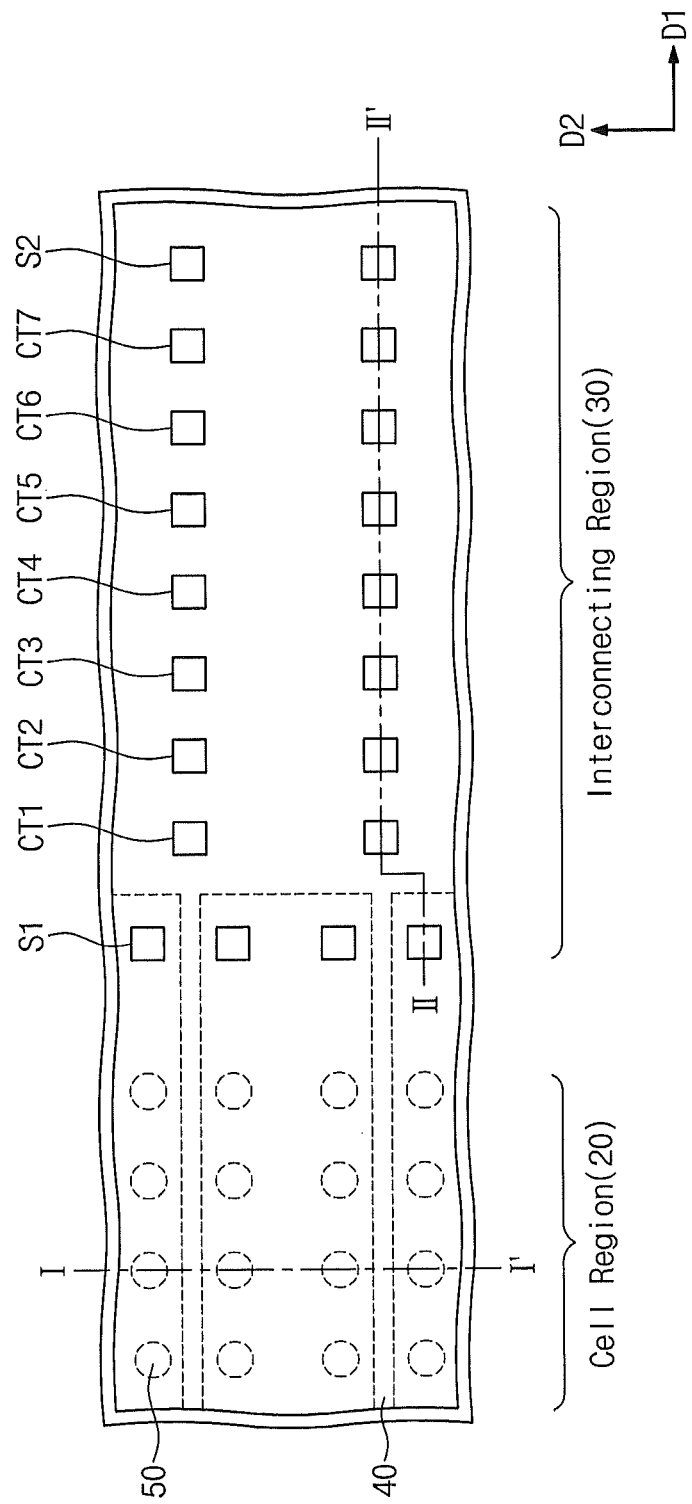
Figure 3B:
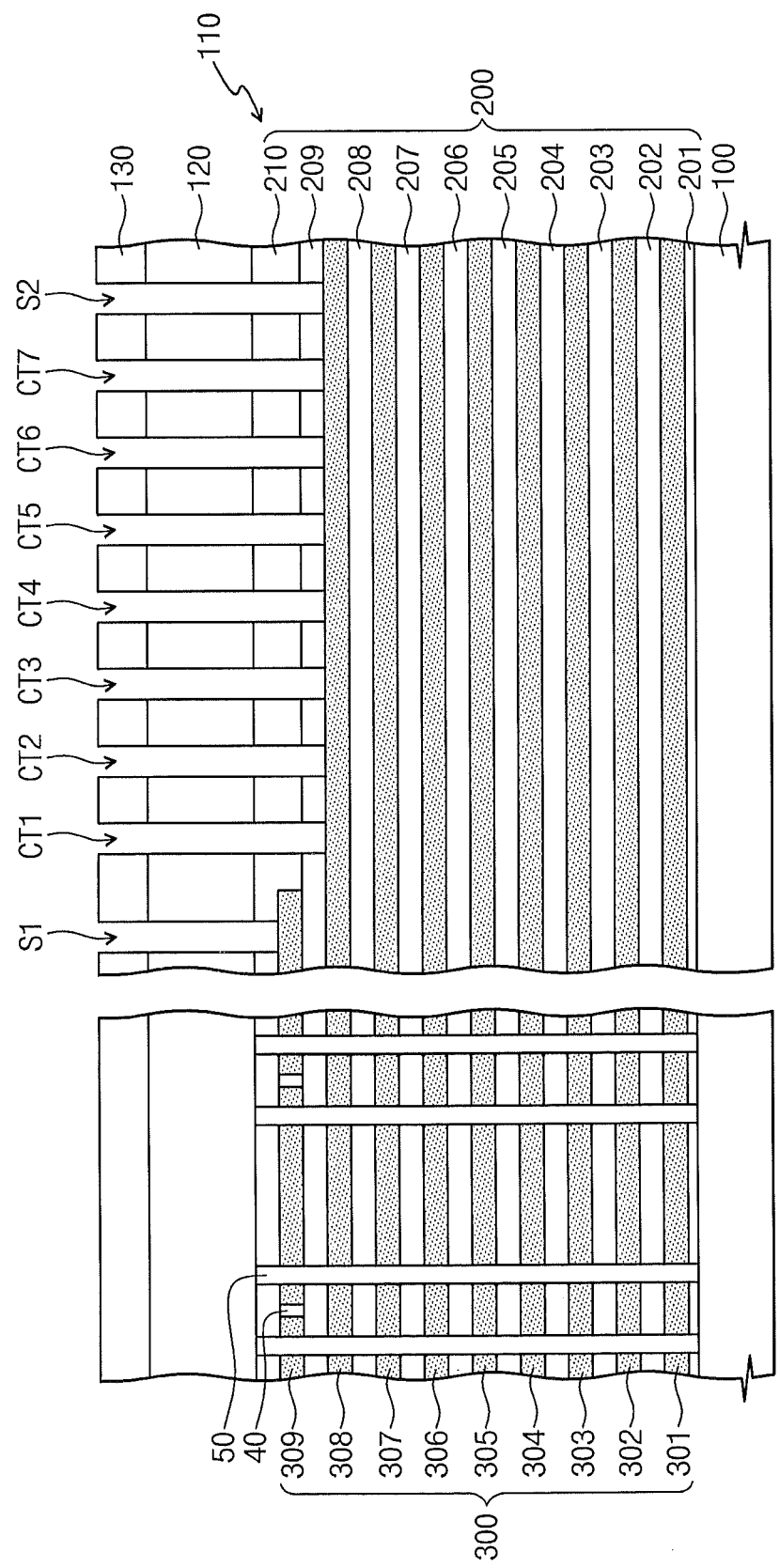

Referring to FIGS. 3A and 3B, a semiconductor device may include a memory cell region 20 in which a plurality of memory cells are disposed, and at least one interconnection region 30 disposed adjacent the memory cell region 20.

A stack 110 may be formed on a substrate 100. The stack 110 may include a plurality of insulating layers 200 and a plurality of sacrificial layers 300 that are alternately stacked on the substrate 100. The insulating layers 200 may include first to tenth insulating layers 201 to 210 and the sacrificial layers 300 may include first to ninth sacrificial layers 301 to 309.

The sacrificial layers 300 may be formed of a material having an etch selectivity with respect to the insulating layers 200. For example, if the insulating layers 200 are formed of silicon oxide, silicon oxynitride, or silicon nitride, the sacrificial layers 300 may be formed of a material that is different from the insulating layers 200, such as at least one of silicon, silicon carbide, silicon oxide, or silicon nitride.

An uppermost ninth sacrificial layer 309 may be patterned to have a linear shape in a D1 direction. The patterns of the ninth sacrificial layer 309 may be separated from each other by a separation region 40 in a D2 direction. The D2 direction crosses the D1 direction. The ninth sacrificial layer 309 may be removed in most of the interconnection region 30.

Thicknesses of the sacrificial layers 300 may not be equal. For example, the uppermost sacrificial layer 309 and a lowermost sacrificial layer 201 may be thicker than other sacrificial layers. Thicknesses of the insulating layers 200 may not be equal. For example, a lowermost insulating layer 201 may be thinner than other insulating layers. The number of the sacrificial layers 300 and the number of the insulating layers 200 may be varied depending on the total number of the memory cell transistors, string selection transistor and the ground selection transistor.

In the memory cell array 10, a plurality of vertical channels 50 may penetrate the plurality of sacrificial layers 300 and the plurality of the insulating layers 200 that are alternately stacked. The vertical channel 50 may include a semiconductor layer.

A first interlayer dielectric layer 120 and a hard mask layer 130 may be formed on the stack 110. The first interlayer dielectric layer 120 may include, for example, silicon oxide. The hard mask layer 130 may include, for example, silicon nitride, silicon oxynitride, or silicon carbide.

In the interconnection region 30, contact holes S1, S2, and CT1 to CT7 may be formed to penetrate the hard mask layer 130 and the first interlayer dielectric layer 120. The contact holes may include an upper selection contact hole S1 that exposes the uppermost ninth sacrificial layer 309, and word line contact holes CT1 to CT7 and a lower selection contact hole S2 that expose a next uppermost sacrificial layer 308. The word line contact holes may include first to seventh word line contact holes CT1 to CT7. The number of the contact holes S1, S2, and CT1 to CT7 may depend on the total number of the memory cell transistors, the string selection transistor and the ground selection transistor.

A bottom surface of the upper selection contact hole S1 may be disposed at a top surface of the uppermost ninth sacrificial layer 309. Bottom surfaces of the word line contact holes CT1 to CT7 and the lower selection contact hole S2 may be disposed at a top surface of the next uppermost eighth sacrificial layer 308. In more detail, for example, the contact holes S1, S2, CT1 to CT7 may be formed using an etching process using the uppermost ninth sacrificial layer 309 and the next uppermost eighth sacrificial layer 308 as etch stop layers.

Figure 4A:
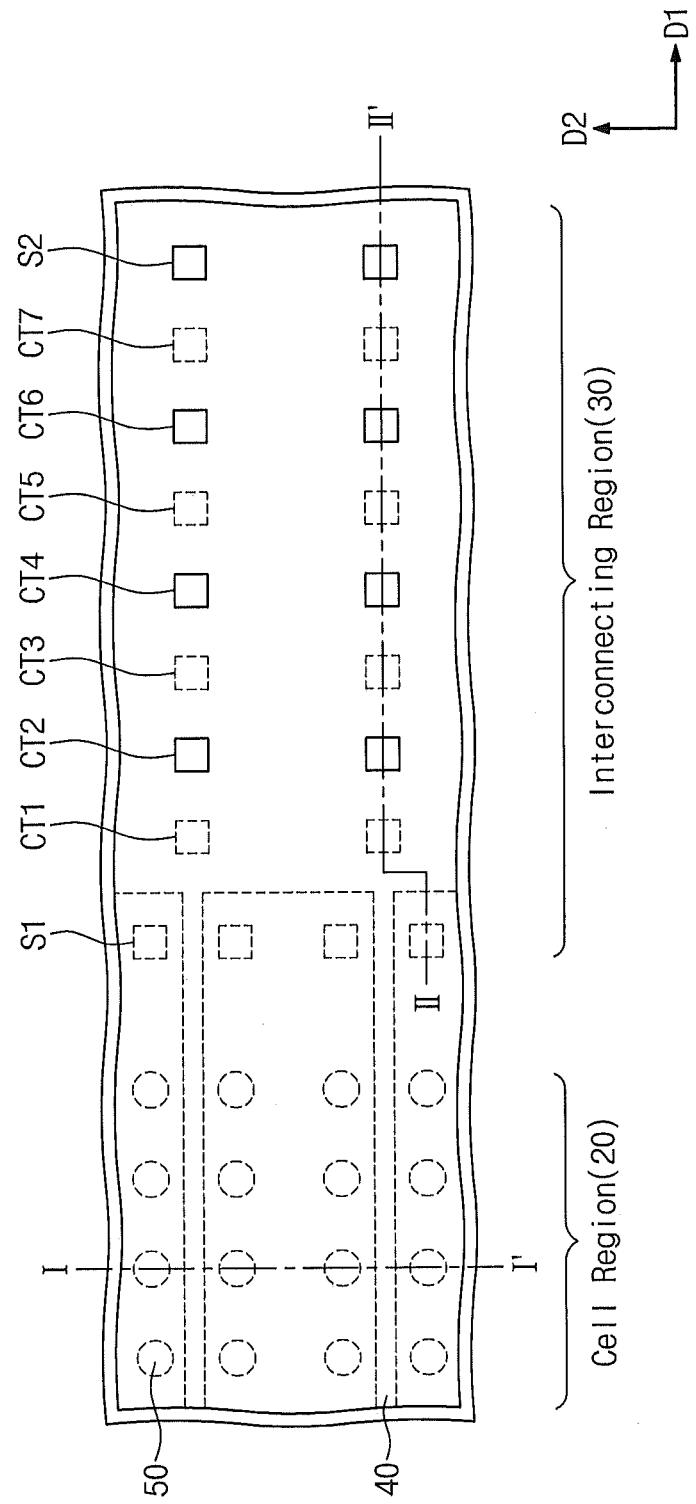
Figure 4B:
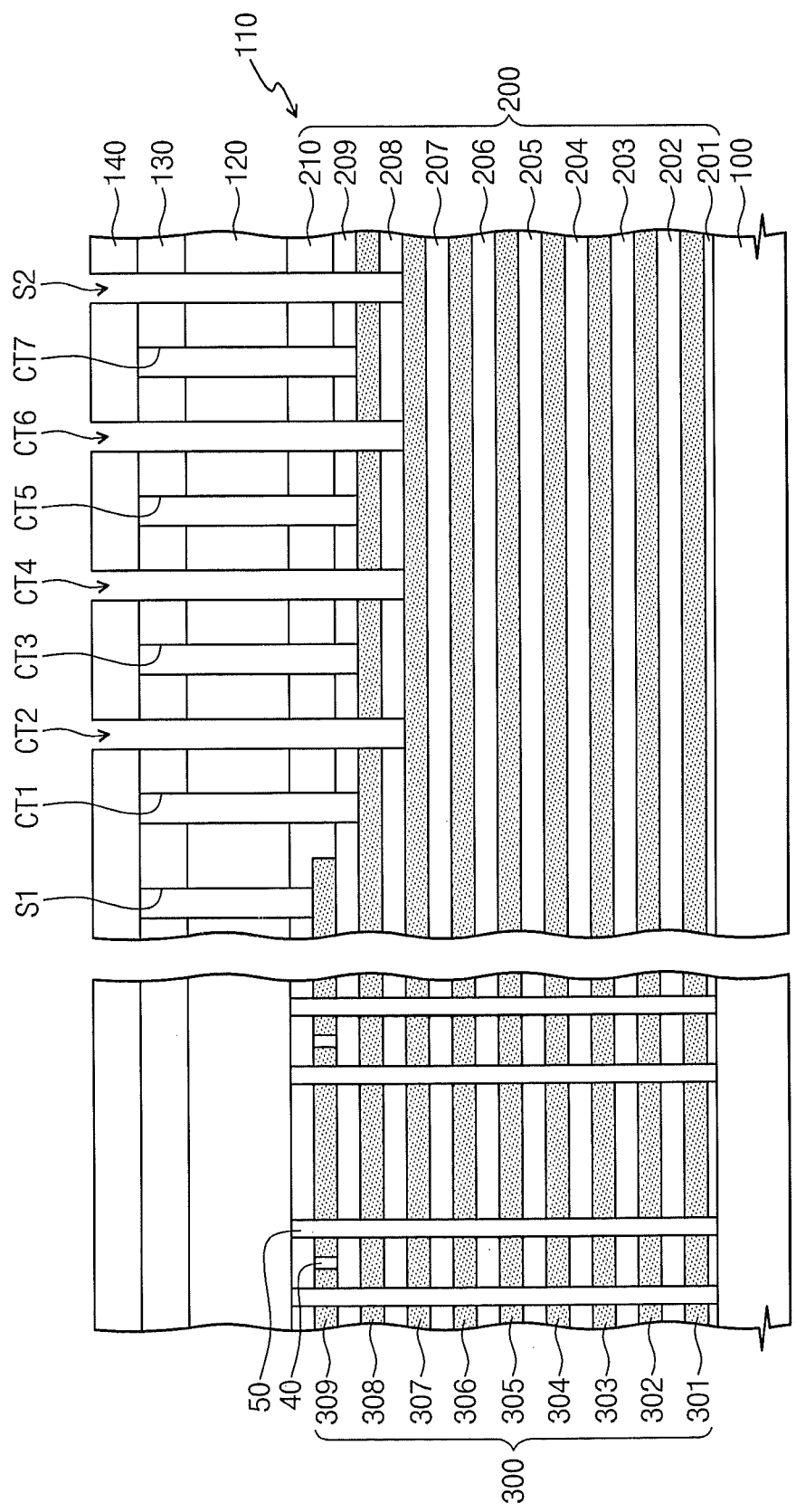

Referring to FIGS. 4A and 4B, a first photoresist pattern 140 exposing the second, fourth and sixth word line contact holes CT2, CT4 and CT6 and the lower selection contact hole S2 may be formed on the hard mask layer 130. The second, fourth and sixth word line contact holes CT2, CT4 and CT6 and the lower selection contact hole S2 may expose a top surface of the seventh sacrificial layer 307 by an etching process using the first photoresist pattern 140. The eighth sacrificial layer 308 is etched. Bottom surfaces of the second, fourth and sixth word line contact holes CT2, CT4 and CT6 and the lower selection contact hole S2 in FIGS. 4A and 4B are lower than those illustrated in FIGS. 3A and 3B, respectively. The bottom surfaces of the second, fourth and sixth word line contact holes CT2, CT4 and CT6 and the lower selection contact hole S2 in FIGS. 4A and 4B may be disposed at the top surface of the seventh sacrificial layer 307.

Figure 5A:
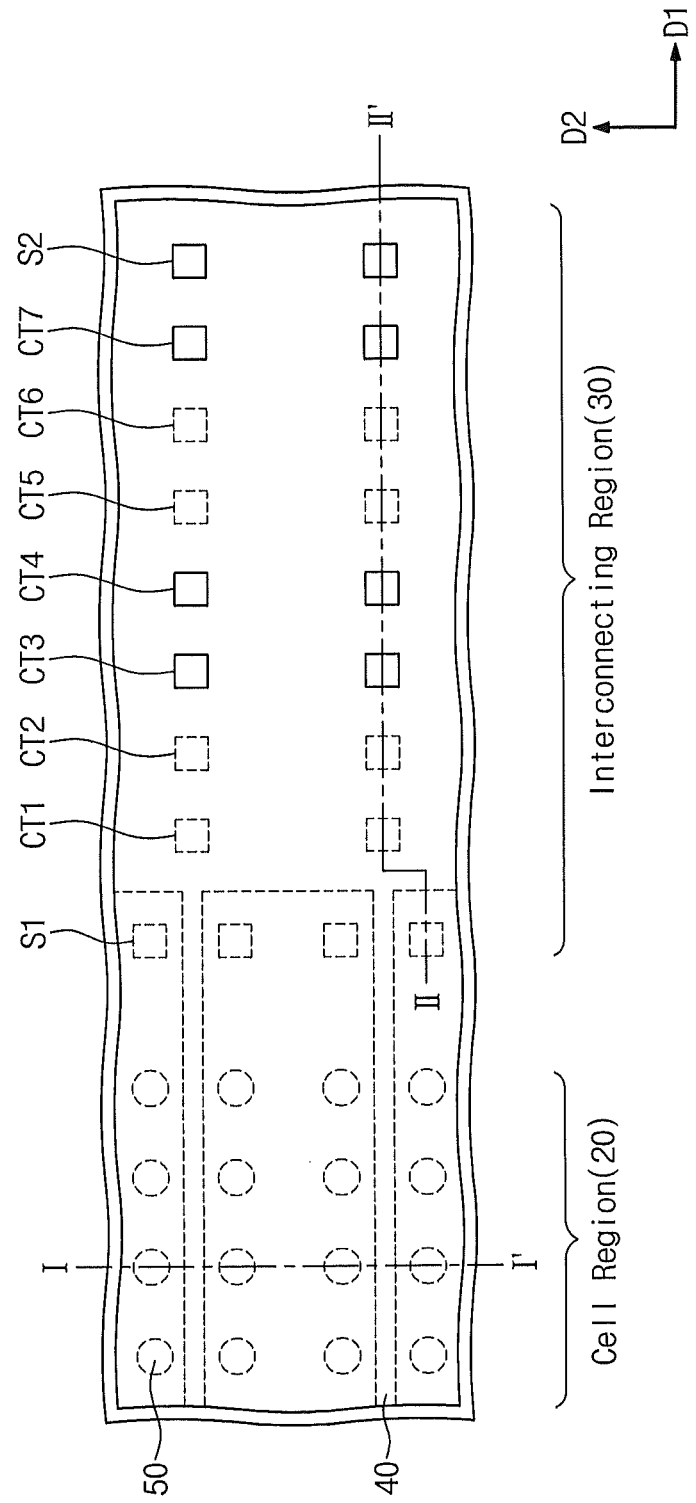
Figure 5B:
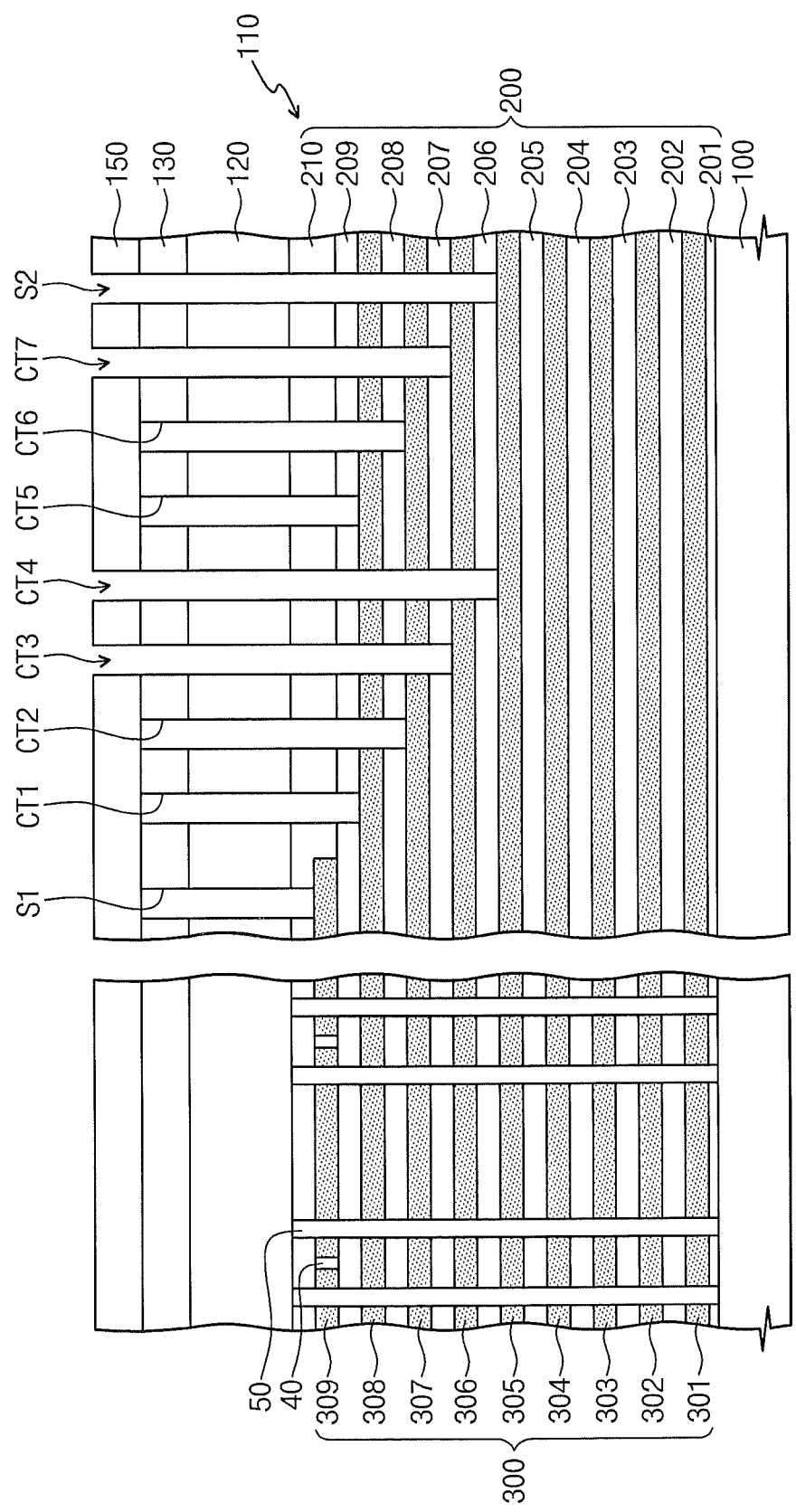

Referring to FIGS. 5A and 5B, after the first photoresist pattern 140 is removed, a second photoresist pattern 150 exposing the third, fourth and seventh word line contact holes CT3, CT4 and CT7 and the lower selection contact hole S2 may be formed on the hard mask layer 130.

The third and seventh word line contact holes CT3 and CT7 may expose a top surface of the sixth sacrificial layer 306 by an etching process using the second photoresist pattern 150. The eighth sacrificial layer 308 and the seventh sacrificial layer 307 are etched. The fourth word line contact hole CT4 and the lower selection contact hole S2 may expose a top surface of the fifth sacrificial layer 305 by the etching process using the second photoresist pattern 150. The seventh sacrificial layer 307 and the sixth sacrificial layer 306 are etched. Bottom surfaces of the third, fourth and seventh word line contact holes CT3, CT4 and CT7 and the lower selection contact hole S2 in FIGS. 5A and 5B become lower than those in FIGS. 4A and 4B, respectively. The bottom surfaces of the third and seventh word line contact holes CT3 and CT7 may be disposed at the top surface of the sixth sacrificial layer 306. The bottom surfaces of the fourth word line contact hole CT4 and the lower selection contact hole S2 may be disposed at the top surface of the fifth sacrificial layer 305.

Figure 6A:
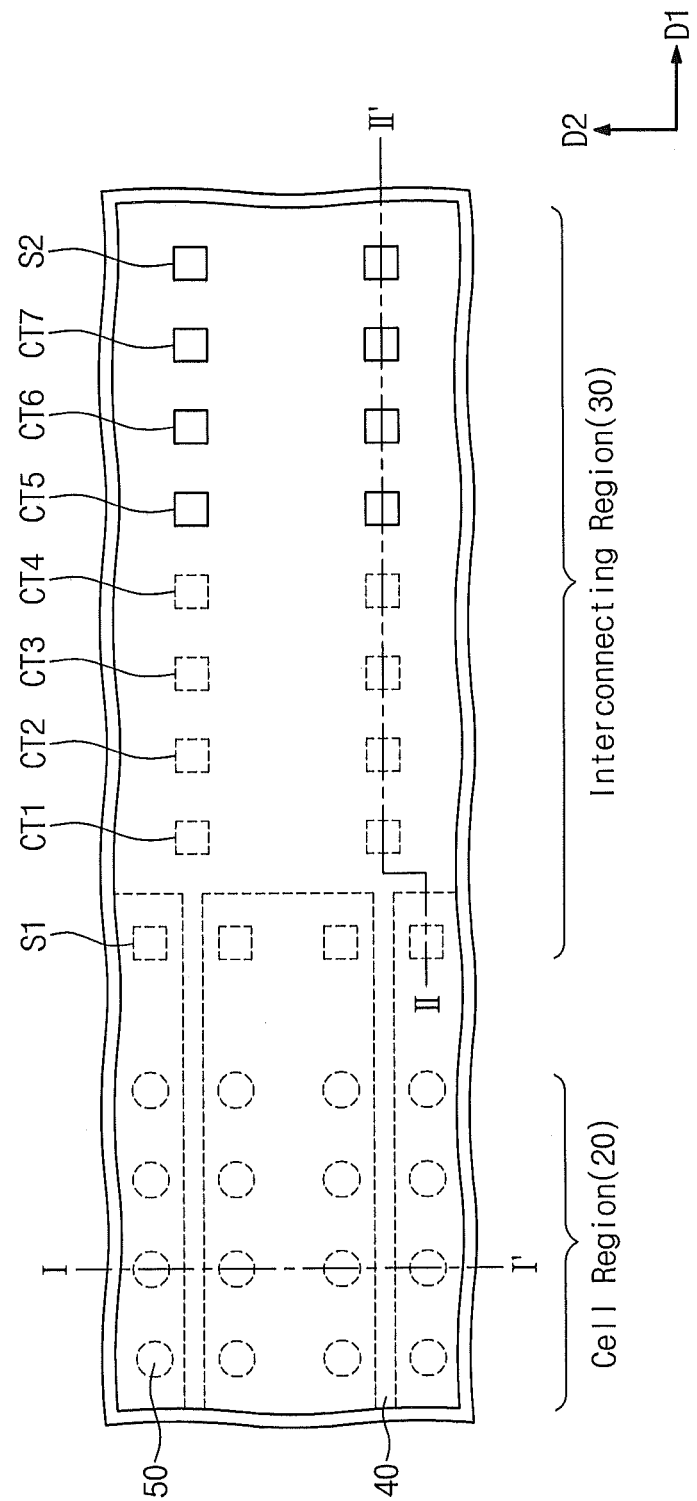
Figure 6B:
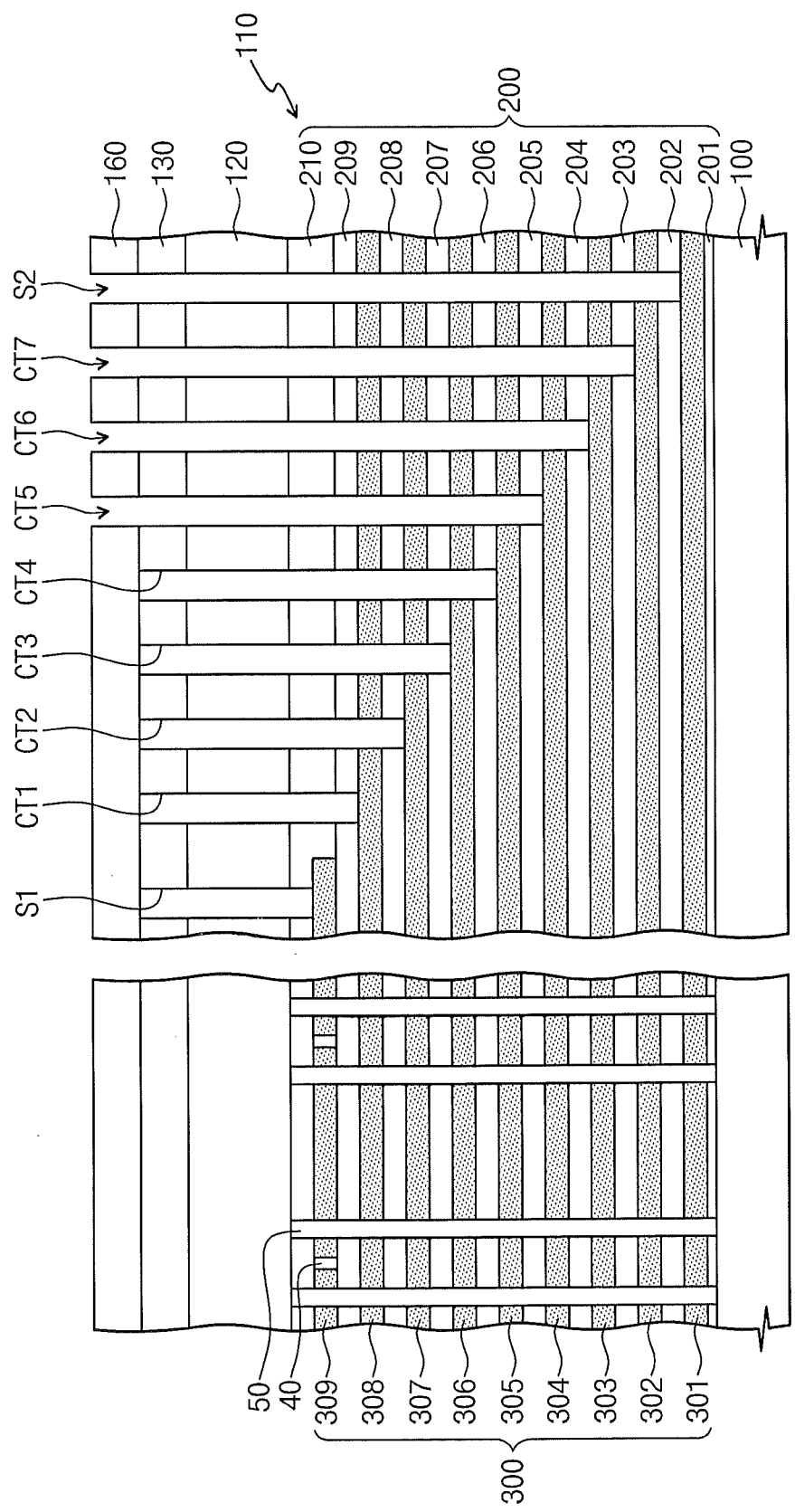

Referring to FIGS. 6A and 6B, after the second photoresist pattern 150 is removed, a third photoresist pattern 160 exposing the fifth, sixth and seventh word line contact holes CT5, CT6 and CT7 and the lower selection contact hole S2 may be formed on the hard mask layer 130. The fifth word line contact hole CT5 may expose a top surface of the fourth sacrificial layer 304 by an etching process using the third photoresist pattern 160. The eighth, seventh, sixth and fifth sacrificial layers 308, 307, 306 and 305 are etched. The sixth word line contact hole CT6 may expose a top surface of the third sacrificial layer 303 by the etching process using the third photoresist pattern 160. The seventh, sixth, fifth and fourth sacrificial layers 307, 306, 305 and 304 are etched. The seventh word line contact hole CT7 may expose a top surface of the second sacrificial layer 302 by the etching process using the third photoresist pattern 160. The sixth, fifth, fourth and third sacrificial layers 306, 305, 304 and 303 are etched. The lower selection contact hole S2 may expose a top surface of the first sacrificial layer 301 by the etching process using the third photoresist pattern 160. The fifth, fourth, third and second sacrificial layers 305, 304, 303 and 302 are etched. Bottom surfaces of the fifth, sixth and seventh word line contact holes CT5 to CT7 and the lower selection contact hole S2 in FIGS. 6A and 6B are lower than those in FIGS. 5A and 5B, respectively. The bottom surface of the fifth word line contact hole CT5 may be disposed at the top surface of the fourth sacrificial layer 304. The bottom surface of the sixth word line contact hole CT6 may be disposed at the top surface of the third sacrificial layer 303. The bottom surface of the seventh word line contact hole CT7 may be disposed at the top surface of the second sacrificial layer 302. The bottom surface of the lower selection contact hole S2 may be disposed at the top surface of the first sacrificial layer 301. In due consideration of process margins according to depths of the word line contact holes, the bottom surfaces of the word line contact holes CT1 to CT7 and the lower selection contact hole S1 which are in contact with the top surfaces of the sacrificial layers may have substantially the same area.

The number of the sacrificial layers 301 to 308, which are penetrated by the word lines contact holes CT to CT7 and the lower selection contact hole S2, are 8 as an example. However, the inventive subject matter is not limited thereto. The number of the sacrificial layers may be changed depending on the number of the memory cell transistors. According to example embodiments of the inventive subject matter, four photoresist pattern formation processes are required in order to form the word line contact holes CT1 to CT7 and the lower selection contact hole S2 corresponding to 8 stacked sacrificial layers covered by the hard mask layer 130 in the interconnection region 30. In other words, the four photoresist pattern processes includes three photoresist pattern processes for forming the word line contact holes CT1 to CT7 and the lower selection contact hole S2 and a photoresist pattern process for forming the hard mask.

Generally, the number of photoresist pattern processes required for generating contact holes penetrating N stacked sacrificial layers is expressed by the following equation (1).

$$N \leq 2^M \qquad \text{equation (1)}$$

In the equation (1), "N" denotes the number of stacked sacrificial layers, "M" denotes an integer, and "M+1" denotes the number of photoresist processes.

$2^M$ is equal to or greater than N. However, photoresist pattern processes may be performed M+1 times when $2^M$ has the closest value to N. According to the above embodiment, the number of the sacrificial layers etched in order to form the word line contact holes and the lower selection contact hole may be changed depending on an order of the photoresist pattern processes. $2^{p-1}$ sacrificial layers are etched where "p" denotes an order number of the photoresist pattern process. For example, "p" of a first photoresist pattern process is 1, "p" of a second photoresist pattern process is 2, and "p" of an n-th photoresist pattern process is n. As described above, "p" denotes the order number of the photoresist pattern process, and the photoresist pattern process of forming the hard mask layer 130 is excluded.

Figure 7A:
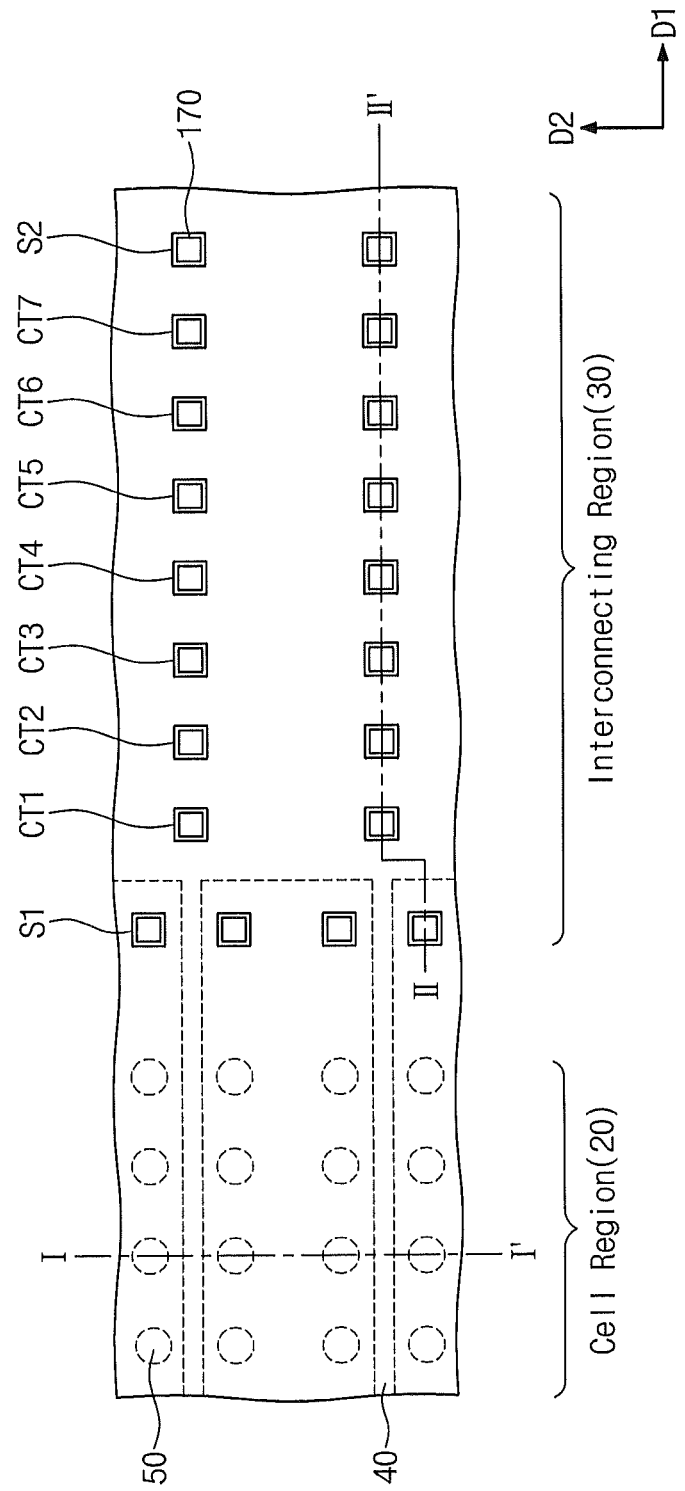
Figure 7B:
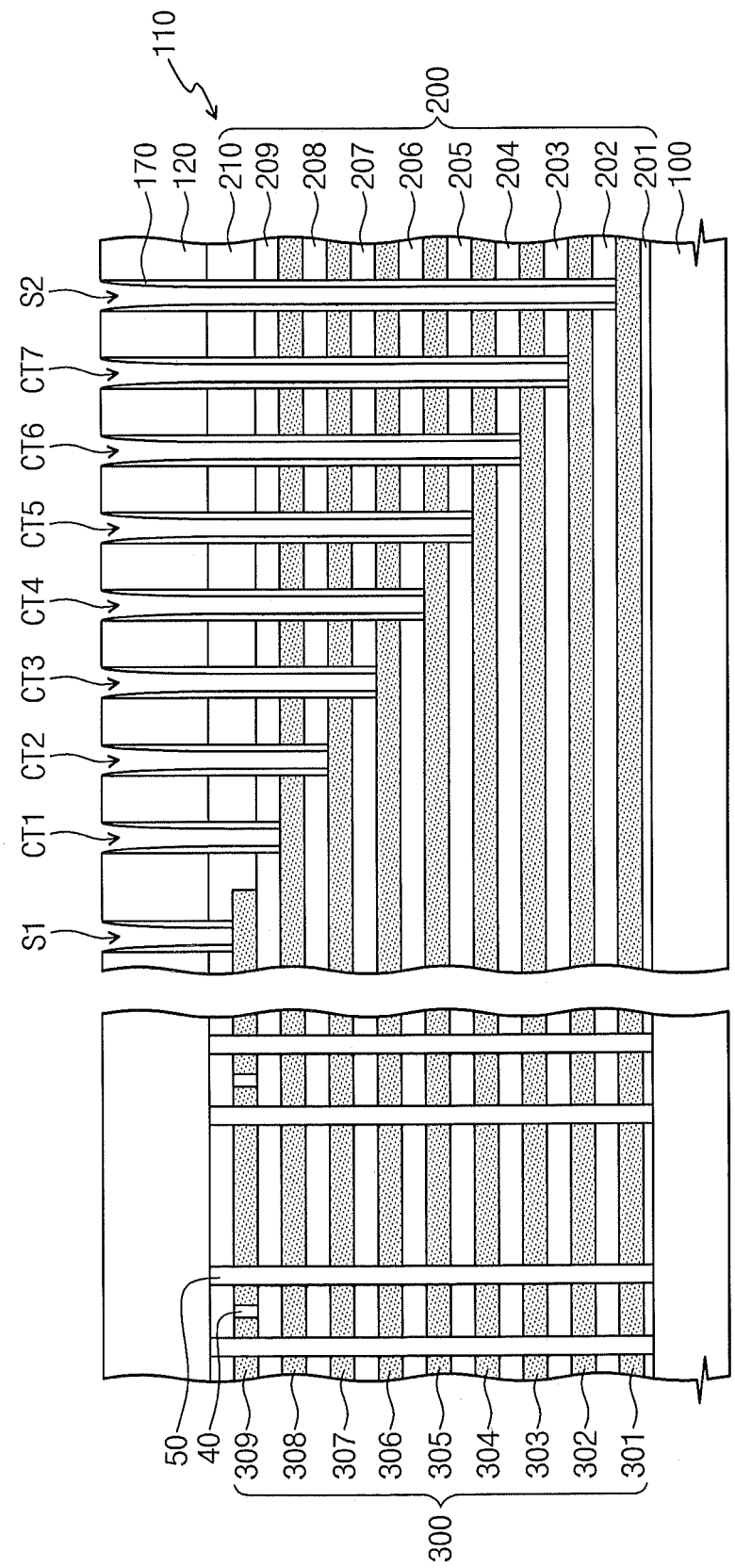

Referring to FIGS. 7A and 7B, the third photoresist pattern 160 and the hard mask layer 130 are removed. Insulating spacers 170 are formed on sidewalls of the contact holes S1, S2 and CT1 to CT7. An insulating layer may be deposited on the stack 110 and then may be anisotropically etched to form the insulating spacers 170. The insulating spacers 170 may be formed in all of the contact holes S1, S2 and CT1 to CT7 at the same time. The insulating spacers 170 may include an insulating material having an etch selectivity with respect to the sacrificial layers 300. The insulating spacers 170 may include, for example, silicon oxide or silicon nitride.

Figure 8A:
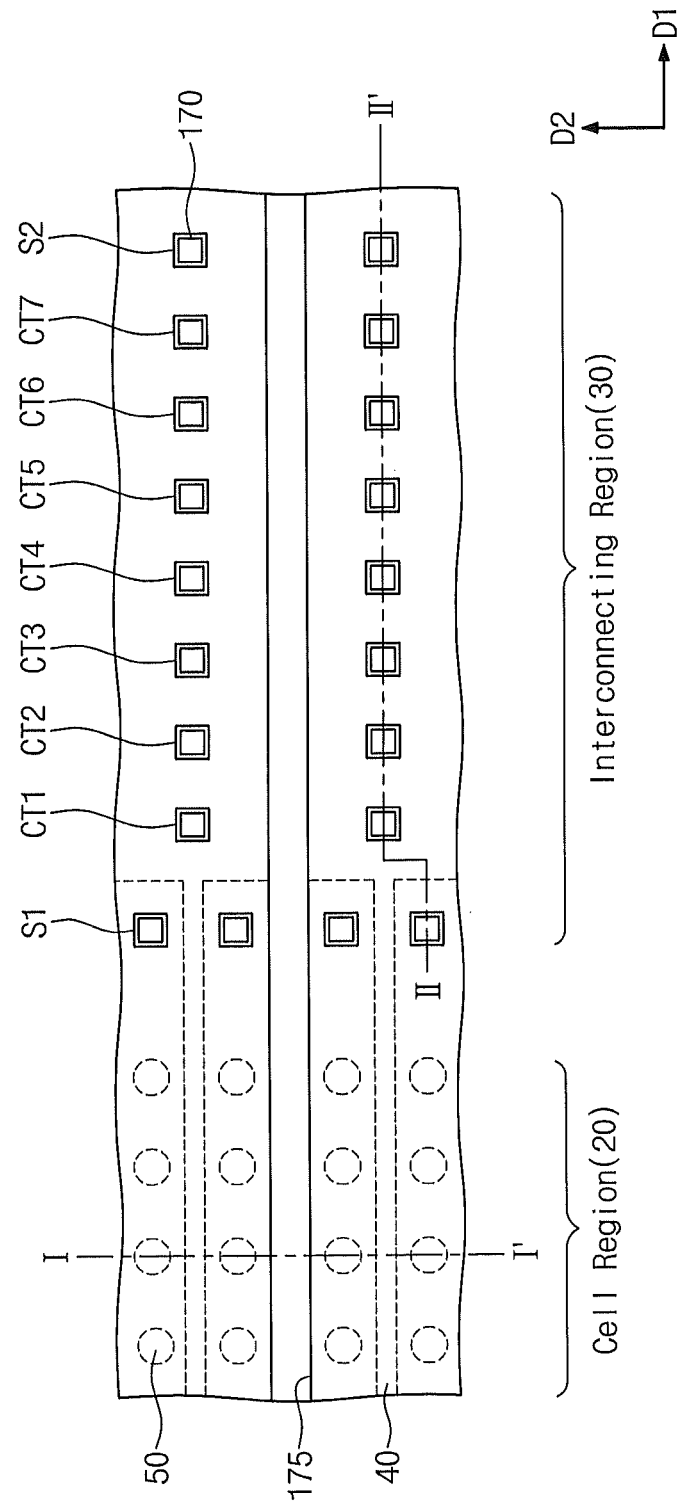
Figure 8B:
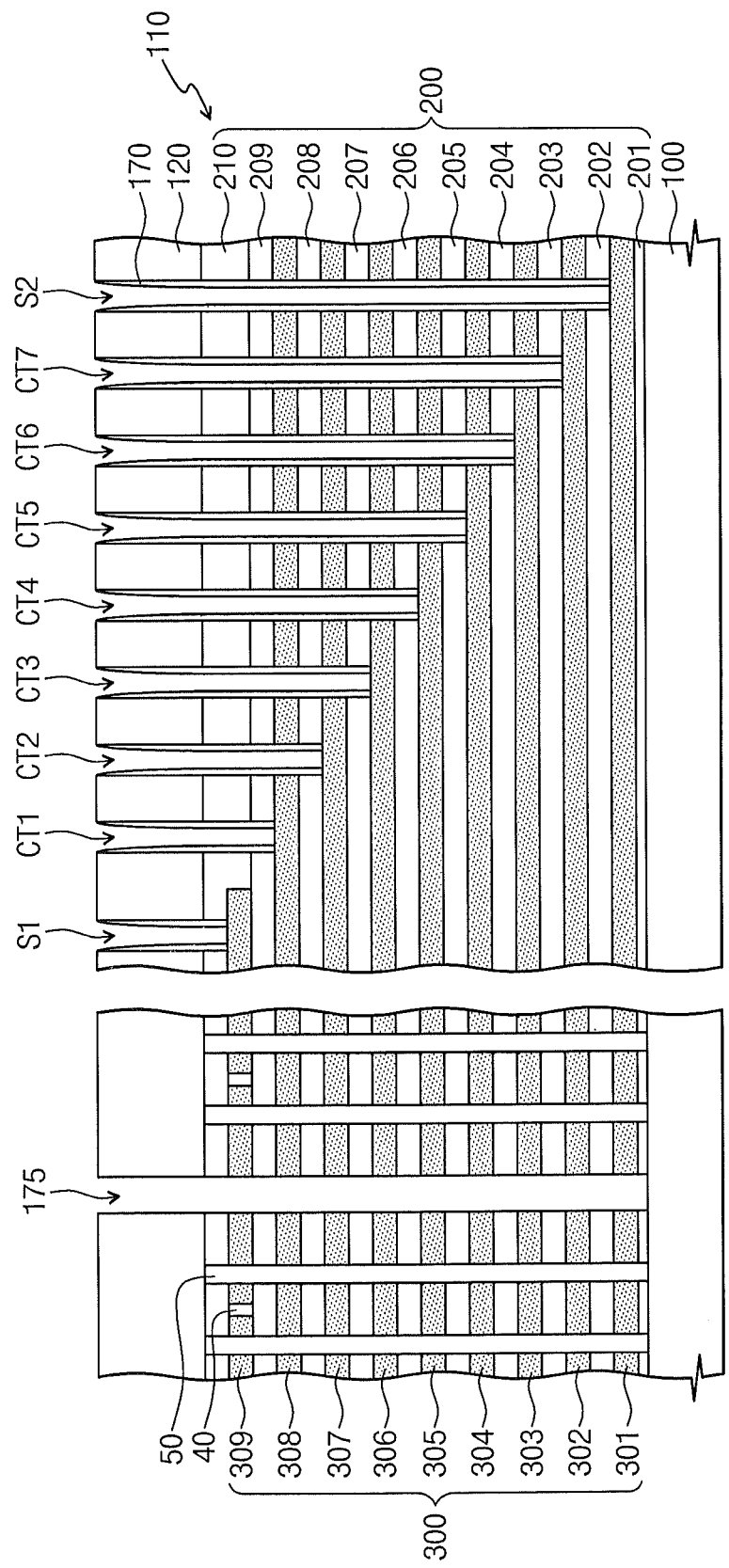

Referring to FIGS. 8A and 8B, an isolation trench 175 is formed in the stack 110. The isolation trench 175 may extend from the cell region 20 into the interconnection region 30 along the D1 direction. The isolation trench 175 may be provided between rows of the vertical channels 50 and between the contact holes S1, S2 and CT1 to CT7. The isolation trench 175 may expose the substrate 100. The isolation trench 175 exposes sidewalls of the plurality of sacrificial layers 300 and sidewalls of the plurality of the insulating layers 200.

Figure 9:
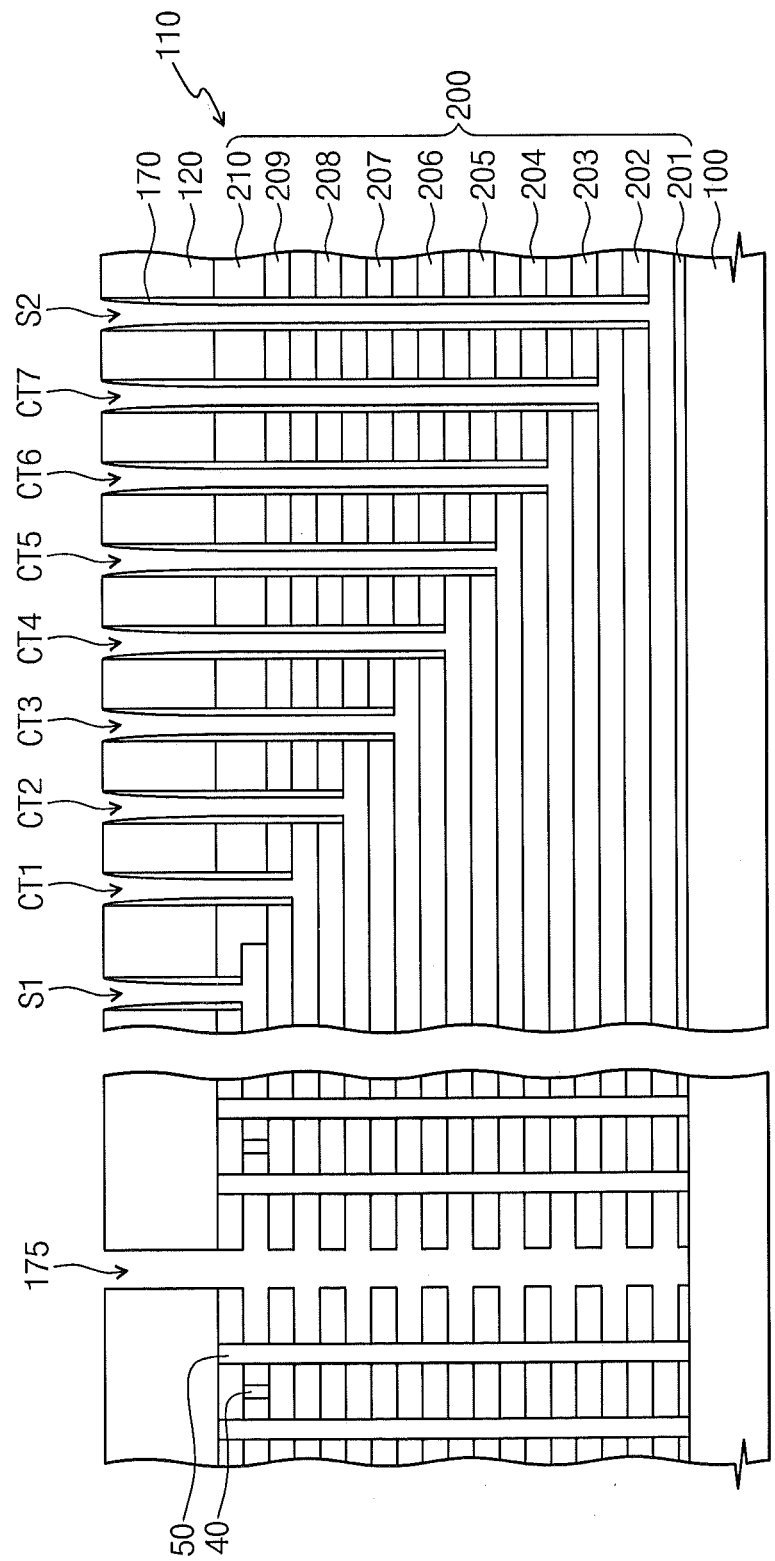
FIGS. 9, 10, and 13 to 16 are cross-sectional views corresponding to lines I-I' and II-II' of FIG. 8A to illustrate operations for manufacturing a semiconductor device according to some embodiments of the inventive subject matter.

Referring to FIG. 9, the sacrificial layers 300 that are exposed by the isolation trench 175 are removed. For example, the sacrificial layers 300 may be selectively removed using an etching solution having an etch selectivity with respect to the insulating layers 200. Thus, in the interconnection region 30, regions formed by the removal of the sacrificial layers 300 may be connected to inner spaces of the contact holes S1, S2 and CT1 to CT7.

Figure 10:
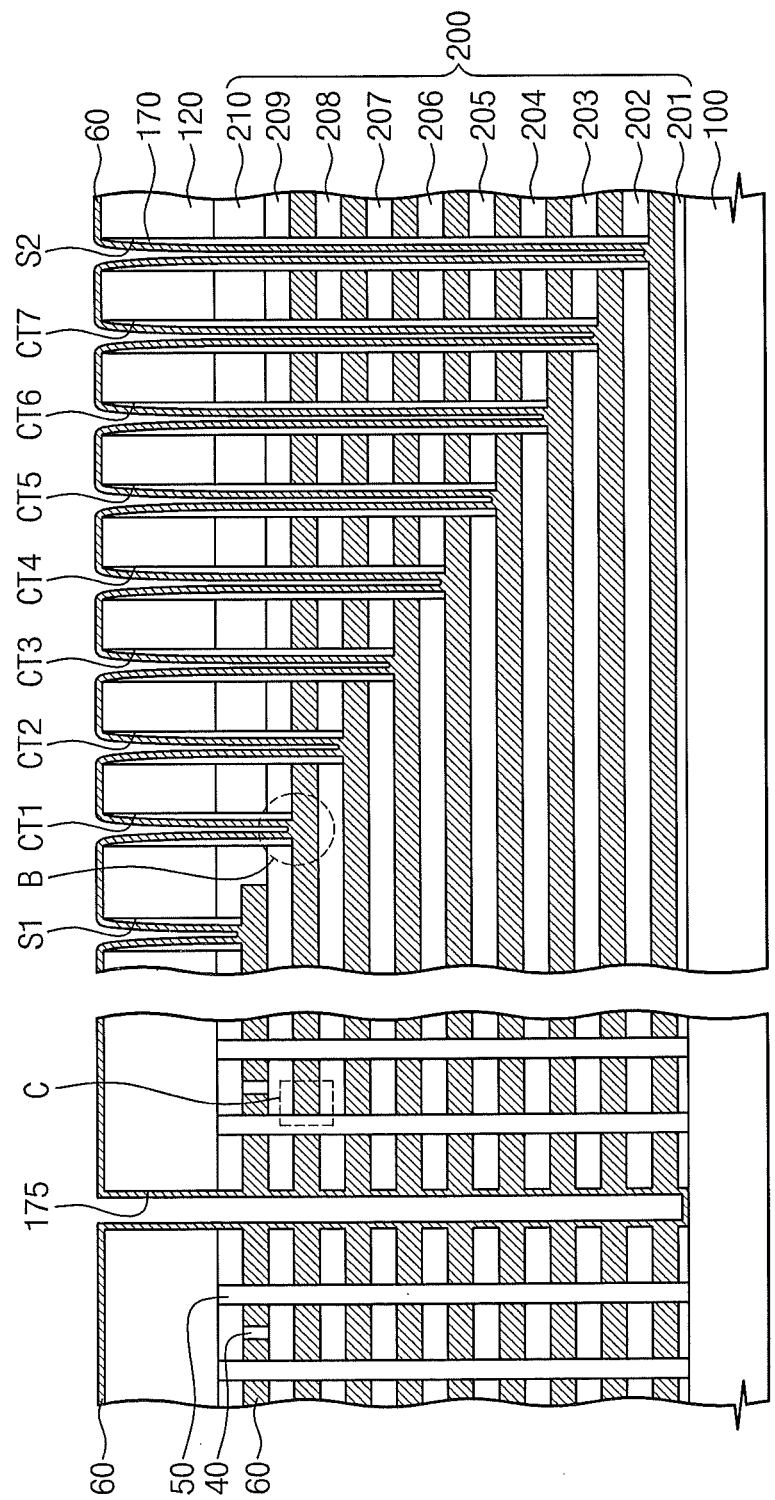
Figure 11:
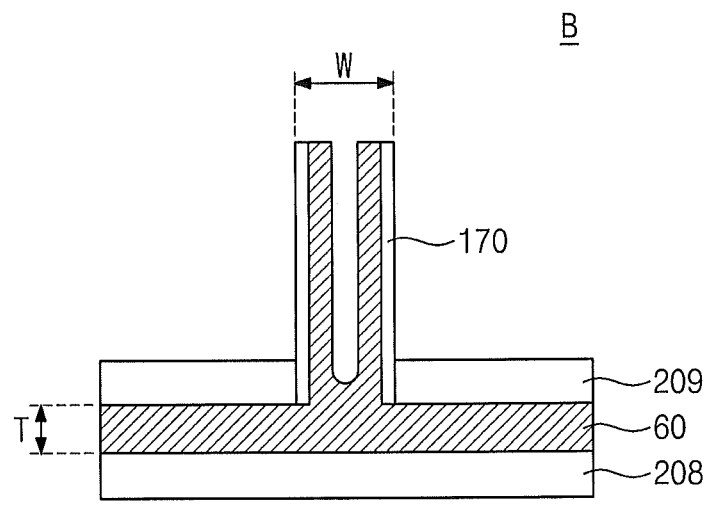
FIG. 11 is an enlarged view of a portion 'B' of FIG. 10.
Figure 12:
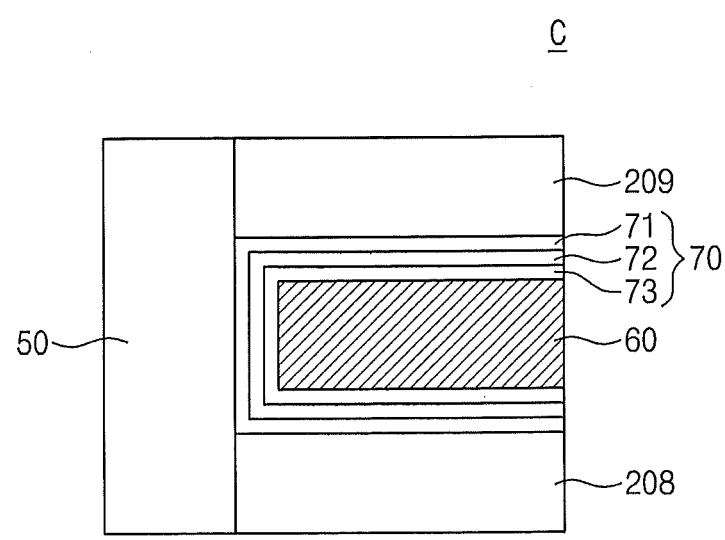
FIG. 12 is an enlarged view of a portion 'C' of FIG. 10.

FIG. 11 is an enlarged view of a portion 'B' of FIG. 10, and FIG. 12 is an enlarged view of a portion 'C' of FIG. 10. Referring to FIGS. 10, 11 and 12, a first conductive layer 60 is formed on the stack 110 including the contact holes S1, S2 and CT1 to CT7 and the regions formed by the removal of the sacrificial layers 300. The first conductive layer 60 may be formed in the spaces formed by the removal of the sacrificial layers 300 and the isolation trench 175 and on the first interlayer dielectric layer 120 in the cell region 20. The first conductive layer 60 may be formed in the spaces formed by the removal of the sacrificial layers 300 and the contact holes S1, S2 and CT1 to CT7 and on the first interlayer dielectric layer 120 in the interconnection region 30 at the same time. A thickness T of the sacrificial layer 300 may be less than a width W of the contact holes S1, S2 and CT1 to CT7. Thus, when the spaces formed by the removal of the sacrificial layers 300 are completely filled with the first conductive layer 60, the contact holes S1, S2 and CT1 to CT7 may be partially filled with the first conductive layer 60. The first conductive layer 60 may include a metal, a metal silicide, and/or a semiconductor doped with dopants. The first conductive layer 60 may be formed using a chemical vapor deposition (CVD) method or an atomic layer deposition (ALD) method. A gate dielectric layer 70 may be disposed between the first conductive layer 60 and the insulating layers 200. The gate dielectric layer 70 may include a tunnel insulating layer 71, a charge storage layer 72 and a blocking insulating layer 73. The tunnel insulating layer 71, the charge storage layer 72 and the blocking insulating layer 73 may be formed using, for example, an ALD process or a CVD process. The charge storage layer 72 may be a charge trap layer or a floating gate layer. The charge storage layer 72 may include quantum dots or nano-crystals. The blocking insulating layer 73 may include a high-k dielectric material having a high dielectric constant. The gate dielectric layer 70 may also be formed between the first conductive layer 60 and the insulating spacer 170.

Figure 13:
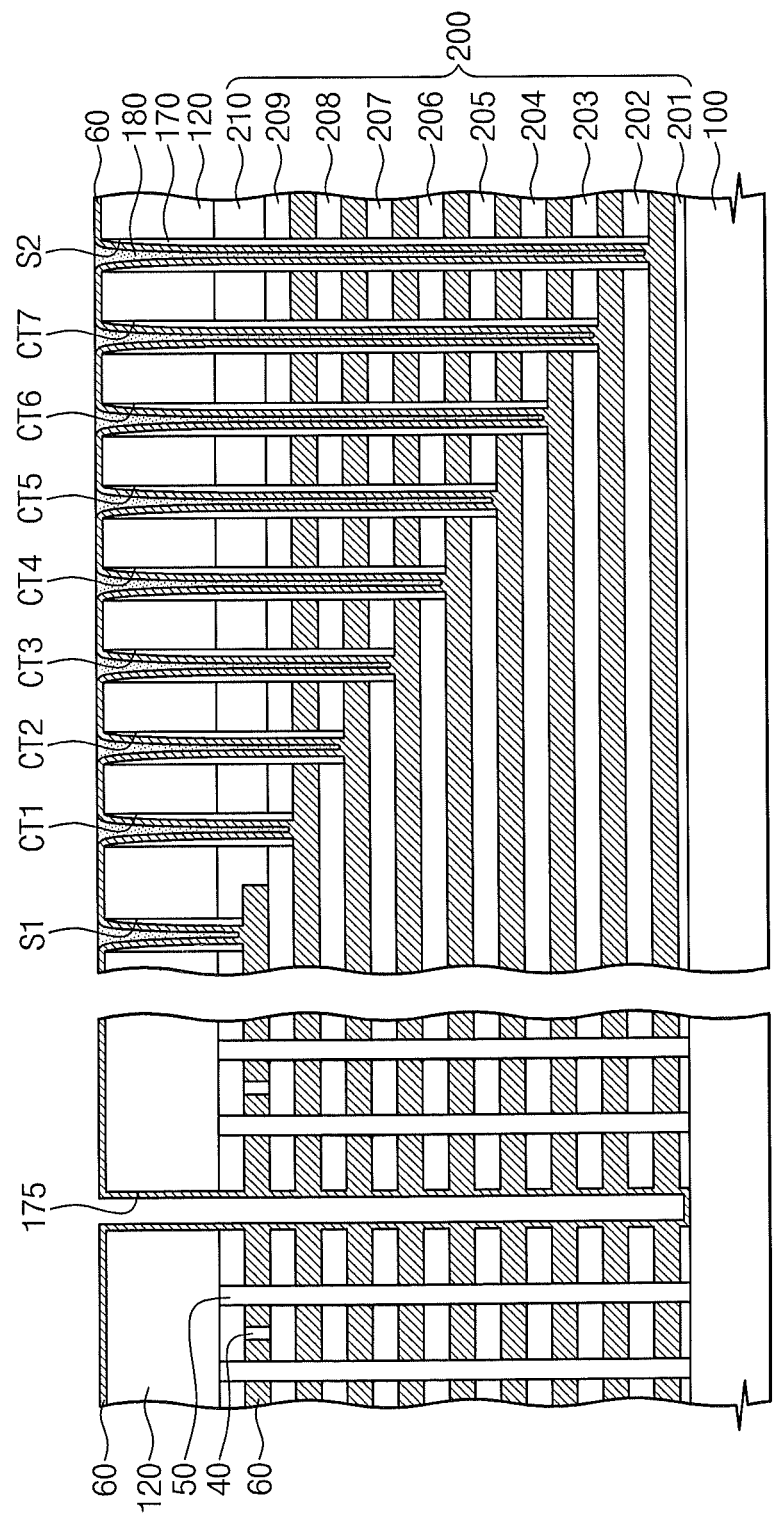

Referring to FIG. 13, a filling sacrificial layer 180 may be formed on the stack 110 to fill the contact holes S1, S2 and CT1 to CT7. The filling sacrificial layer 180 may include a material having an etch selectivity with respect to the first conductive layer 60. For example, the filling sacrificial layer 180 may include silicon oxide. The filling sacrificial layer 180 outside the contact holes S1, S2 and CT1 to CT7 may be removed. The filling sacrificial layer 180 may be removed using an etching solution. When portions of the filling sacrificial layer 180 are removed, the first conductive layer 60 on the first interlayer dielectric layer 120 may be exposed.

Figure 14:
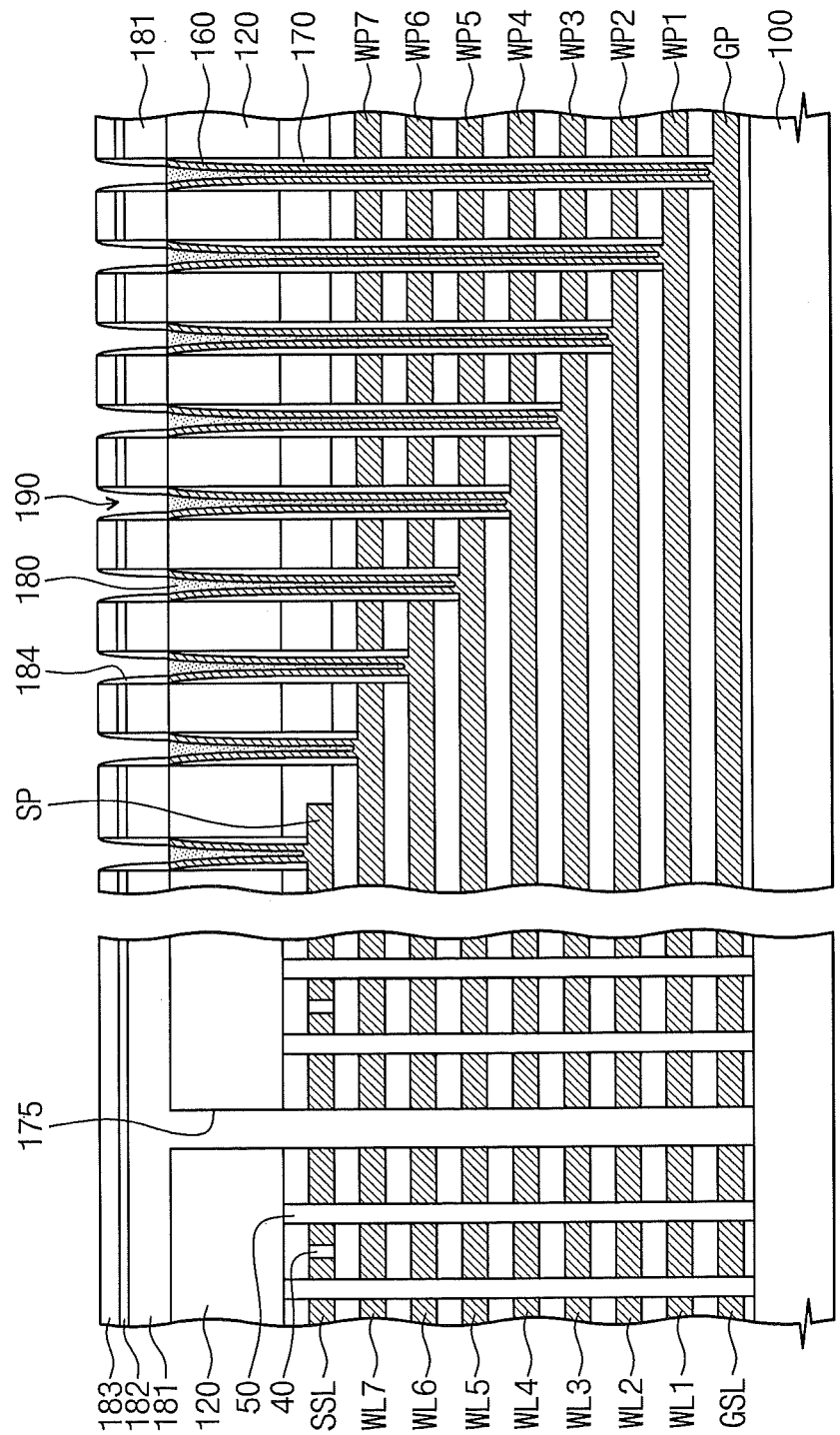

Referring to FIG. 14, the exposed first conductive layer 60 on the first interlayer dielectric layer 120 is removed. The first conductive layer 60 in the isolation trench 175 is removed. The first conductive layer 60 may be removed using an etching solution. Thus, a string selection line SSL, word lines WL1 to WL7 and a ground selection line GSL may be formed in the cell region 20. A string selection line pad SP extending from the string selection line SSL, word line pads WP1 to WP7 extending from the word lines WL1 to WL7, and a ground selection line pad GP extending from the ground selection line GSL may be formed in the interconnection region 30.

An isolation insulating layer 181, a first etch stop layer 182 and a second interlayer dielectric layer 183 are sequentially formed on the stack 110. The isolation trench 175 may be filled with the isolation insulating layer 181. The isolation insulating layer 181 and the second interlayer dielectric layer 183 may include silicon oxide layers, respectively. The first etch stop layer 182 may include a material layer having an etch selectivity with respect to the isolation insulating layer 181 and the second interlayer dielectric layer 183. For example, the first etch stop layer 182 may include a silicon nitride layer.

The isolation insulating layer 181, the first etch stop layer 182 and the second interlayer dielectric layer 183 may be patterned to form openings 190 respectively aligned with the contact holes S1, S2 and CT1 to CT7 in the interconnection region 30. The filling sacrificial layer 180 is exposed by the opening 190. A second etch stop layer is formed on the stack 110. The second etch stop layer is anisotropically etched to form second spacer 184 on a sidewall of each opening 190. The first and second etch stop layers may be formed of the same material.

Figure 15:
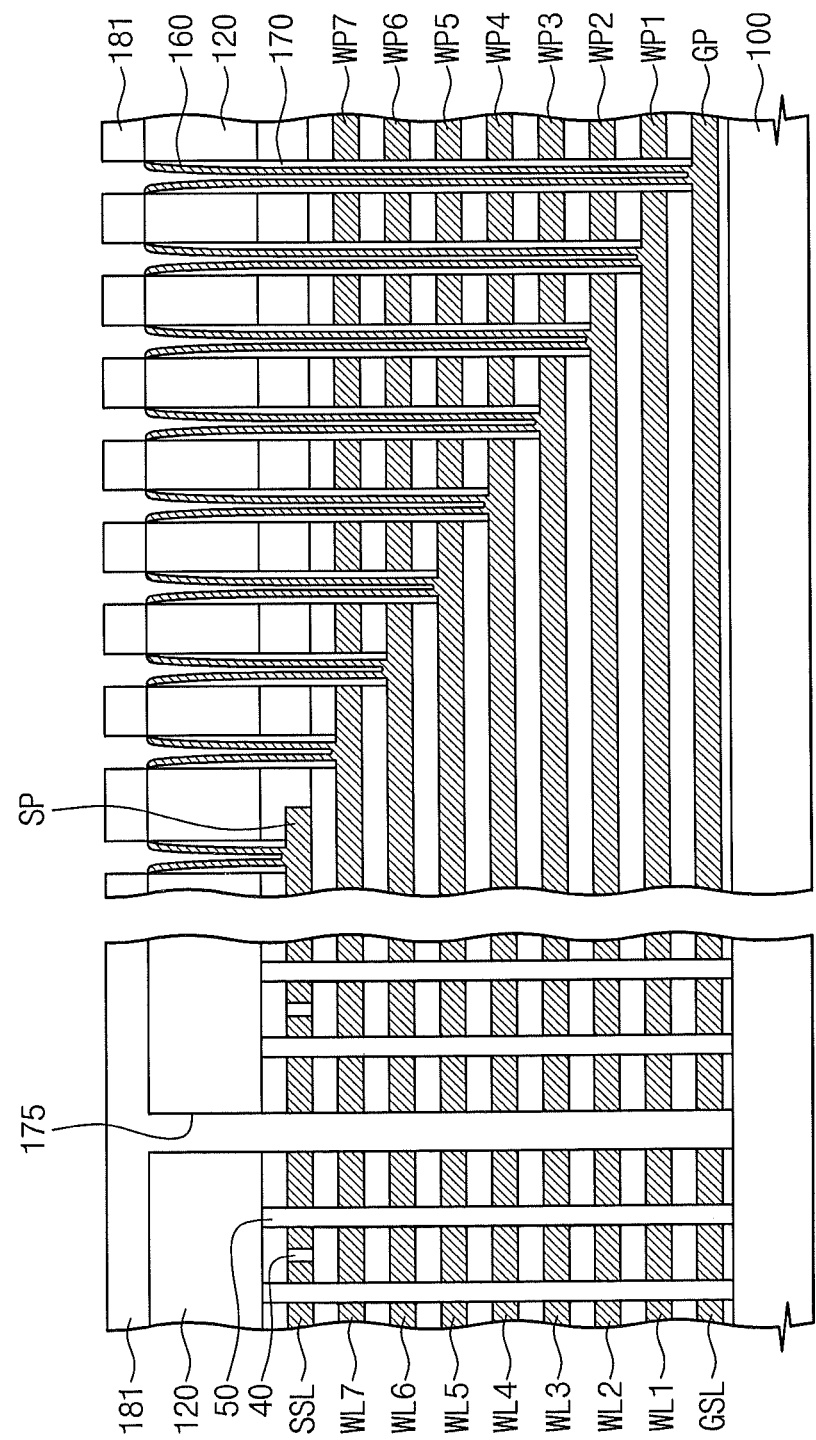

Referring to FIG. 15, the second interlayer dielectric layer 183 on the stack 110 and the filling sacrificial layer 180 may be removed by an isotropic etching process using the first etch stop layer 182 and the second spacers 184 as etch stop layers. Next, the first etch stop layer 182 and the second spacers 184 are removed using an etching solution (e.g., a phosphoric acid solution).

Figure 16:
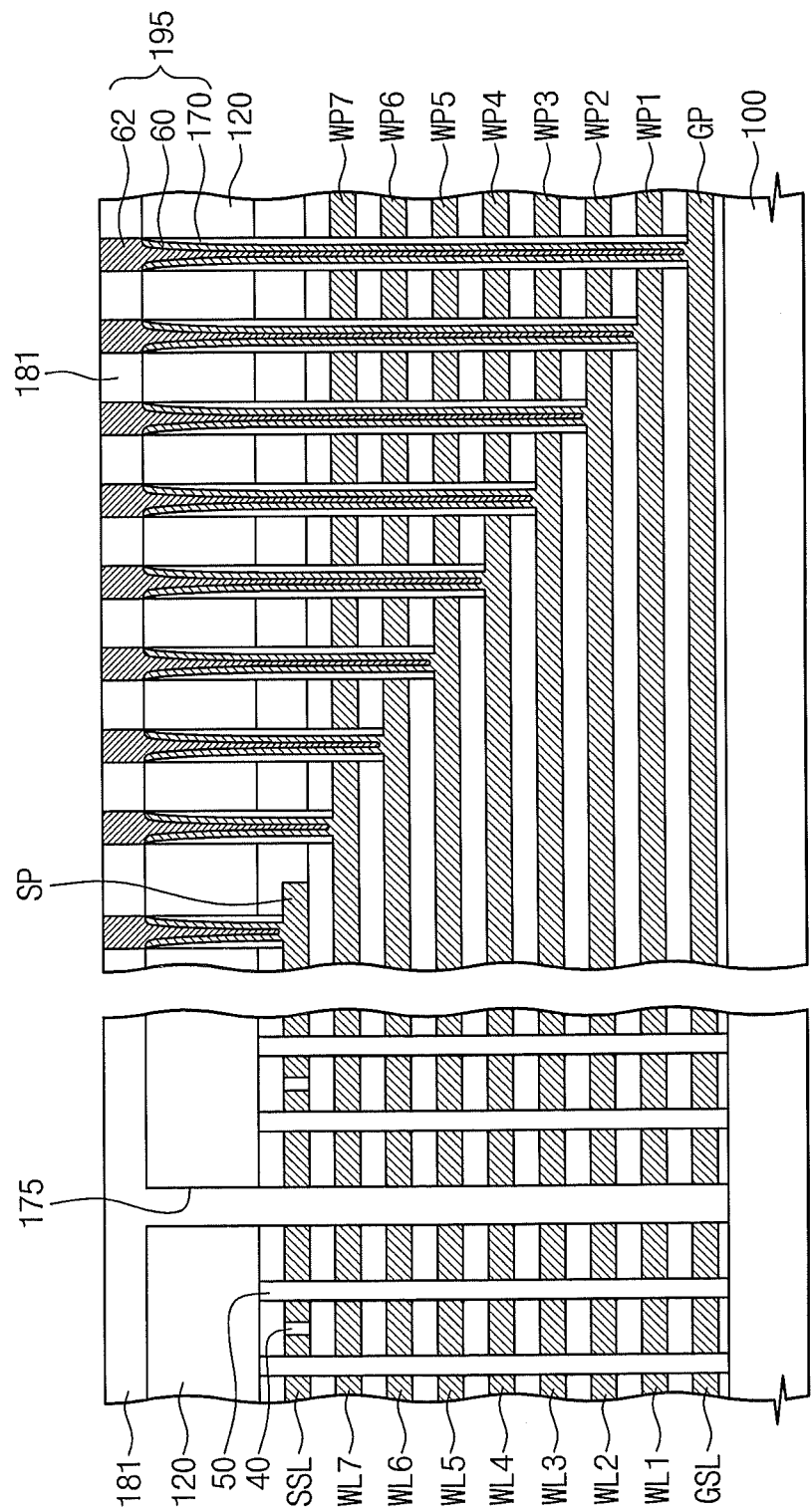

Referring to FIG. 16, a second conductive layer 62 is deposited on the stack 110 to fill the contact holes S1, S2 and CT1 to CT7 and the openings 190. The portions of the second conductive layer 62 outside the openings 190 may be removed using a chemical mechanical polishing (CMP) process, thereby separating nodes of plugs 195 from each other. The plug 195 may include the first conductive layer 60, the second conductive layer 62 and the insulating spacer 170. Sidewalls parallel to the D1 direction of the word line pads WP1 to WP7 electrically connected to the plugs 195 may be substantially vertically aligned with each other. Heights of bottom surfaces of the plugs 195 may be different from each other. The heights of the bottom surfaces of the plug 195 may be sequentially lowered as a distance from the cell region 20 is increased. A height difference between the plugs 195 adjacent to each other may be substantially equal to a height difference between the word line pads WP1 to WP7 adjacent to each other. A thickness of each of the word lines WL1 to WL7 may be less than a width of each of the plugs 195.

Seven stacked word lines and seven stacked word line pads are illustrated in the drawings. However, the inventive subject matter is not limited thereto. The number of the stacked word lines and the number of the stacked word line pads may be changed depending on the number of the memory cell transistors included in the cell string.

Figure 17A:
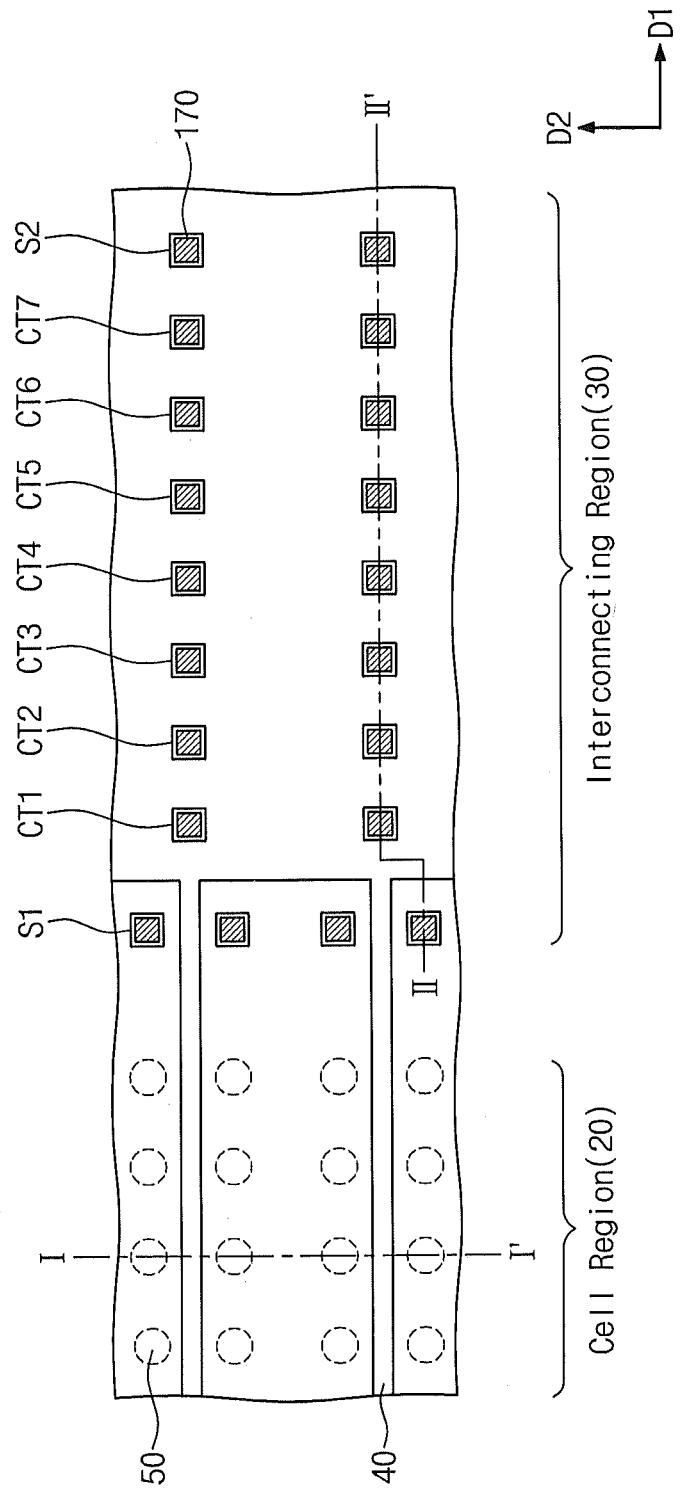
FIGS. 17A and 18A are plan views illustrating operations for manufacturing a semiconductor device according to some embodiments of the inventive subject matter.
Figure 17B:
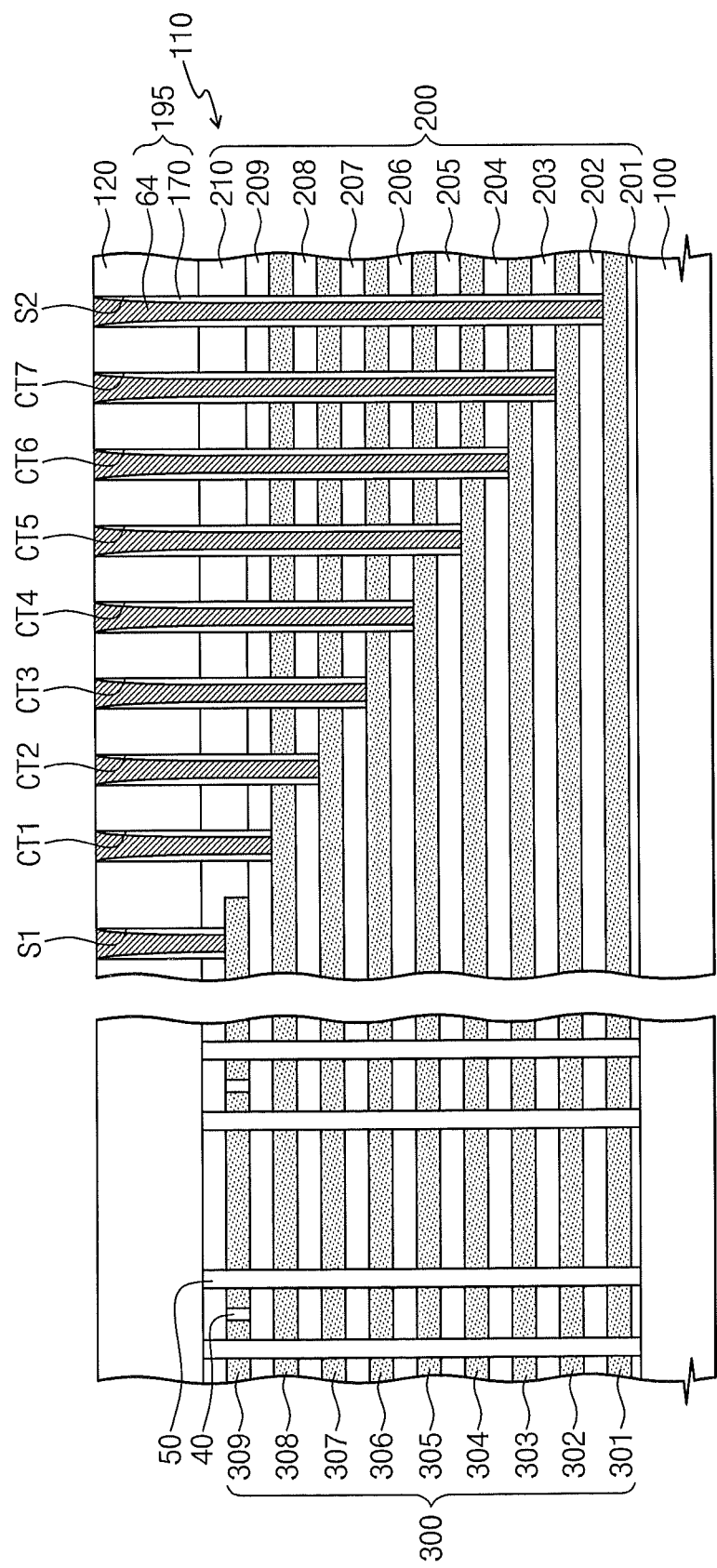
FIGS. 17B and 18B are cross-sectional views taken along lines I-I' and II-II' of FIGS. 17A and 18A, respectively.
Figure 18A:
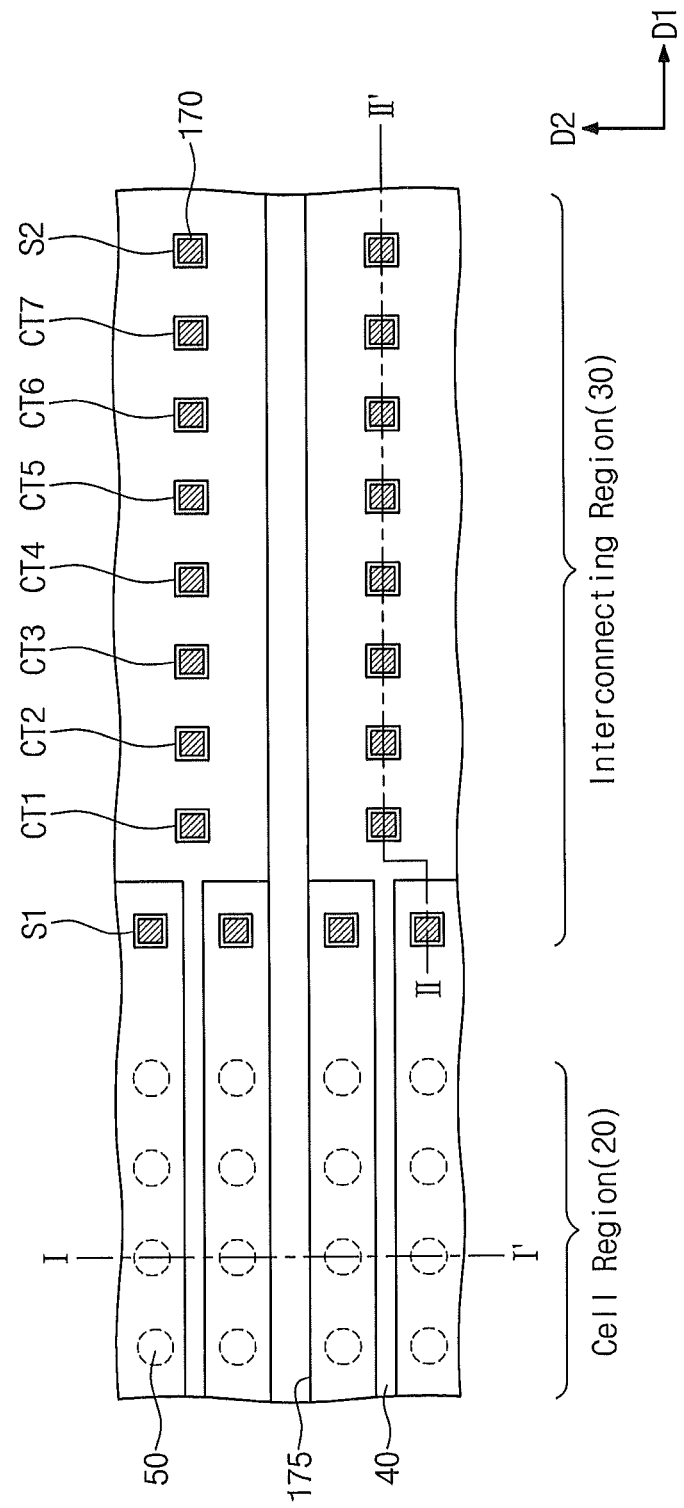
Figure 18B:
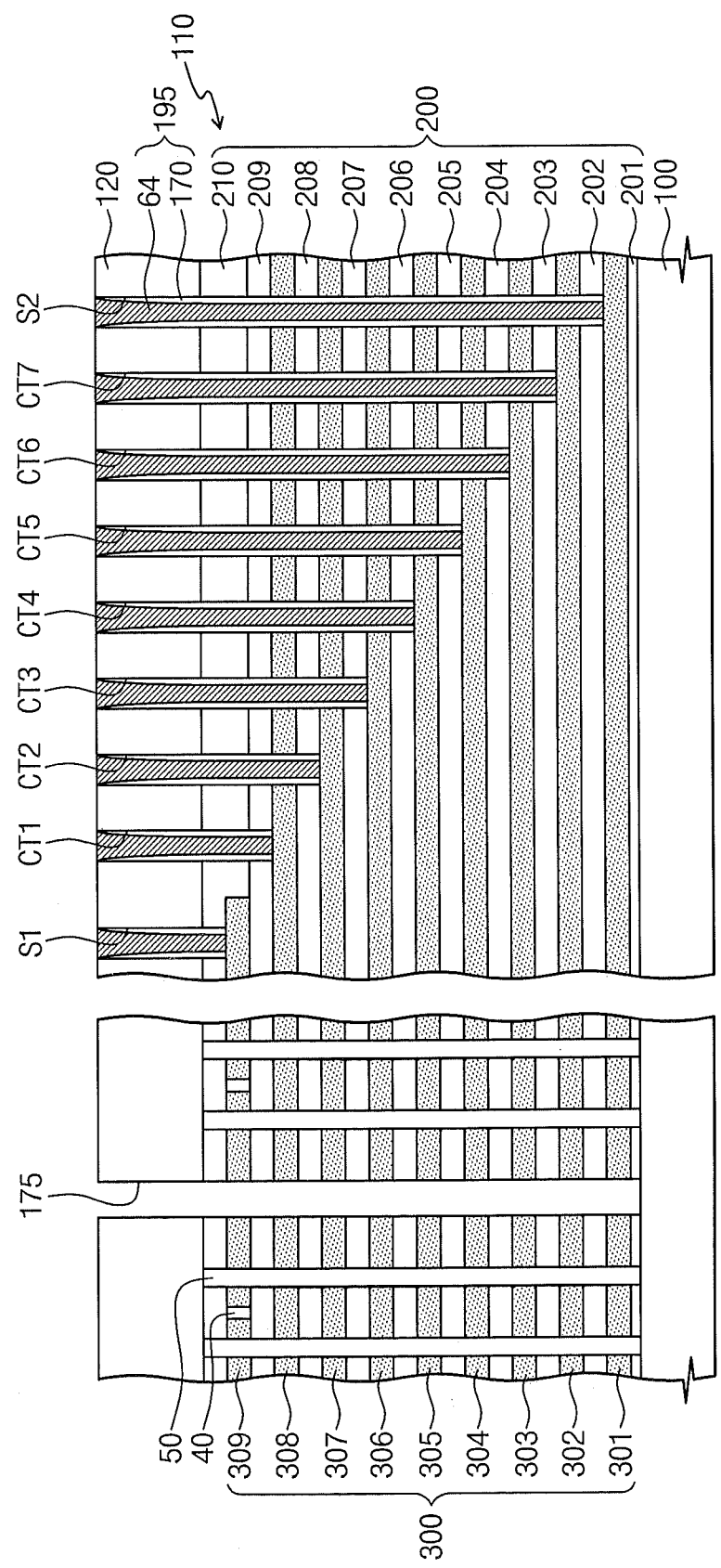
Figure 19:
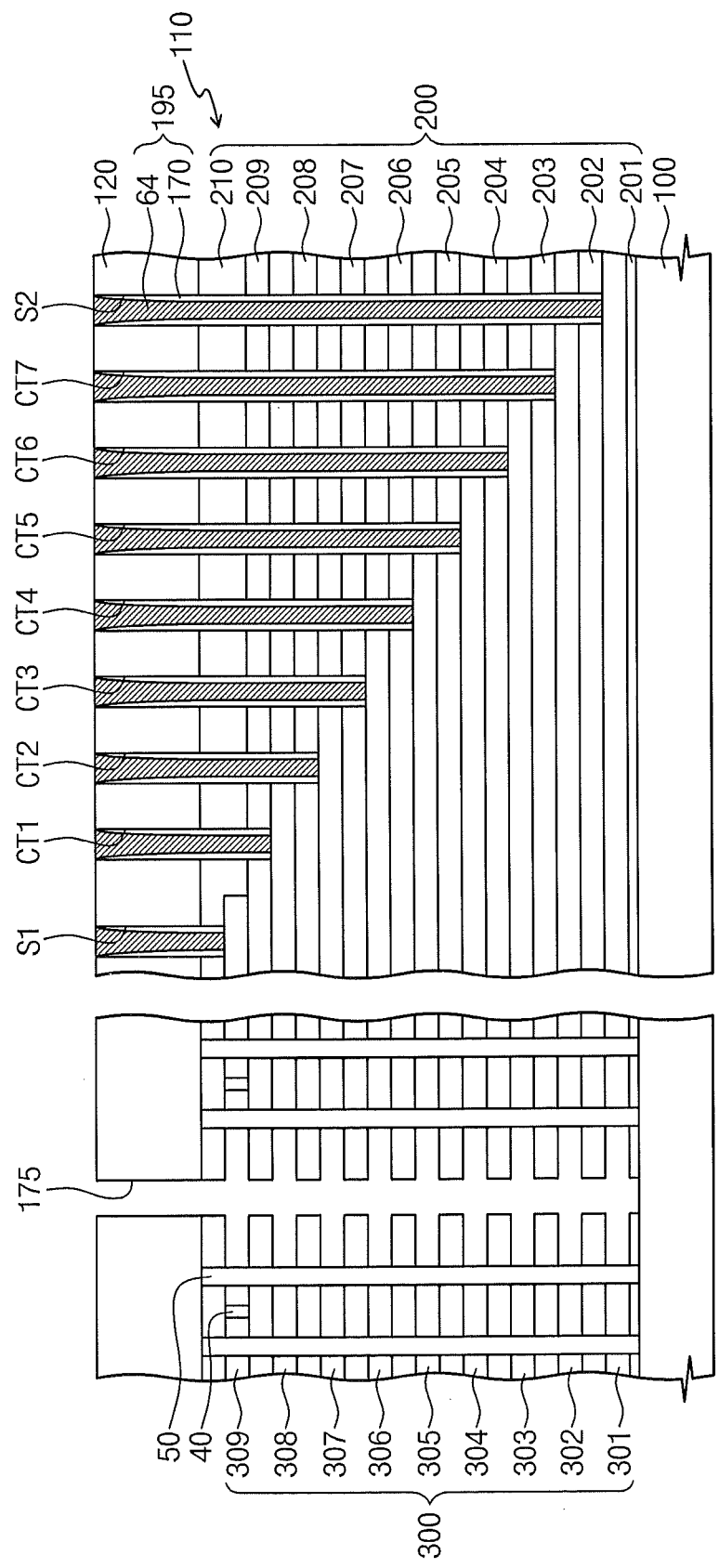
FIGS. 19 to 21 are cross-sectional views corresponding to lines I-I' and of FIG. 17A to operations for manufacturing a semiconductor device according to some embodiments of the inventive subject matter.
Figure 20:
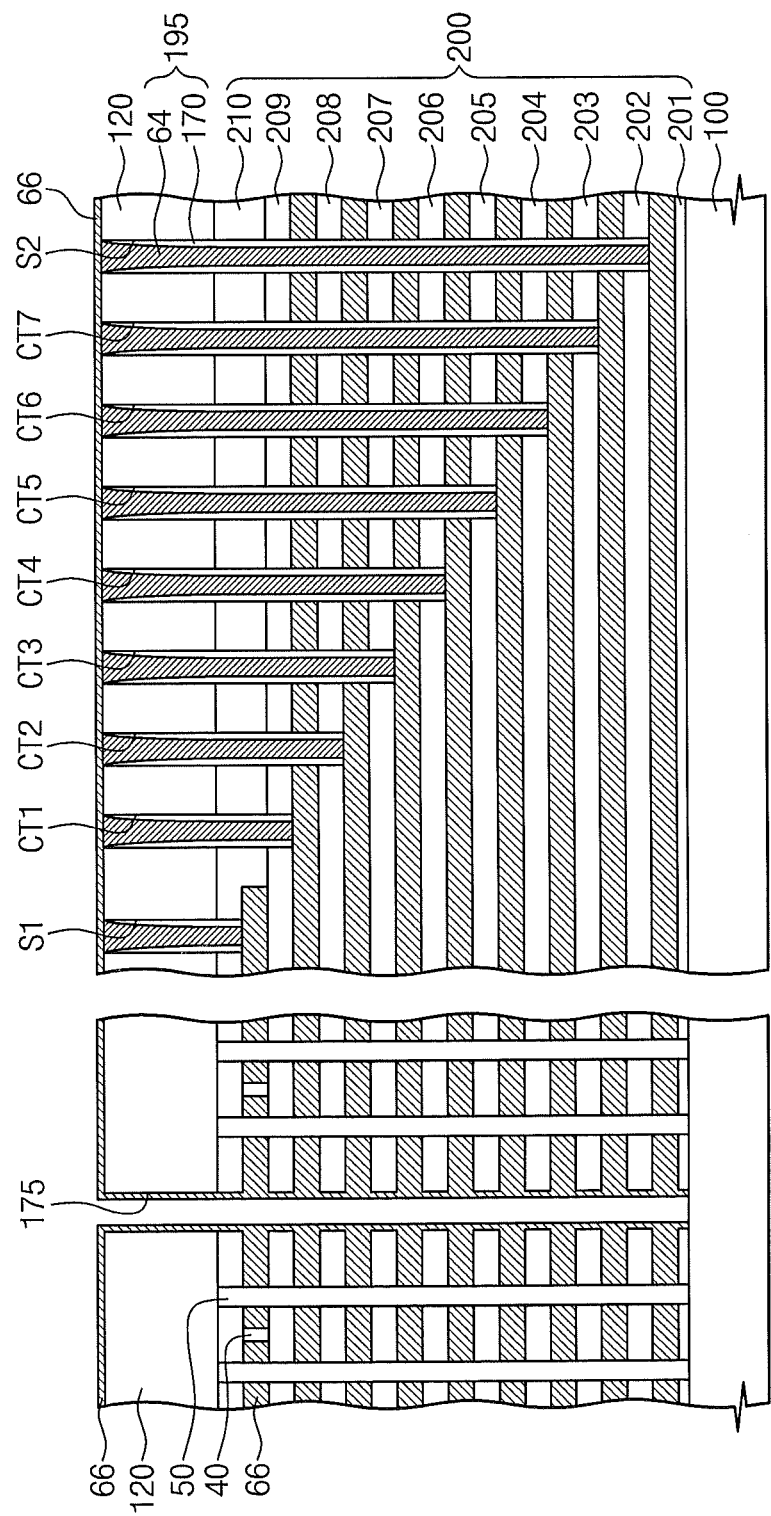
Figure 21:
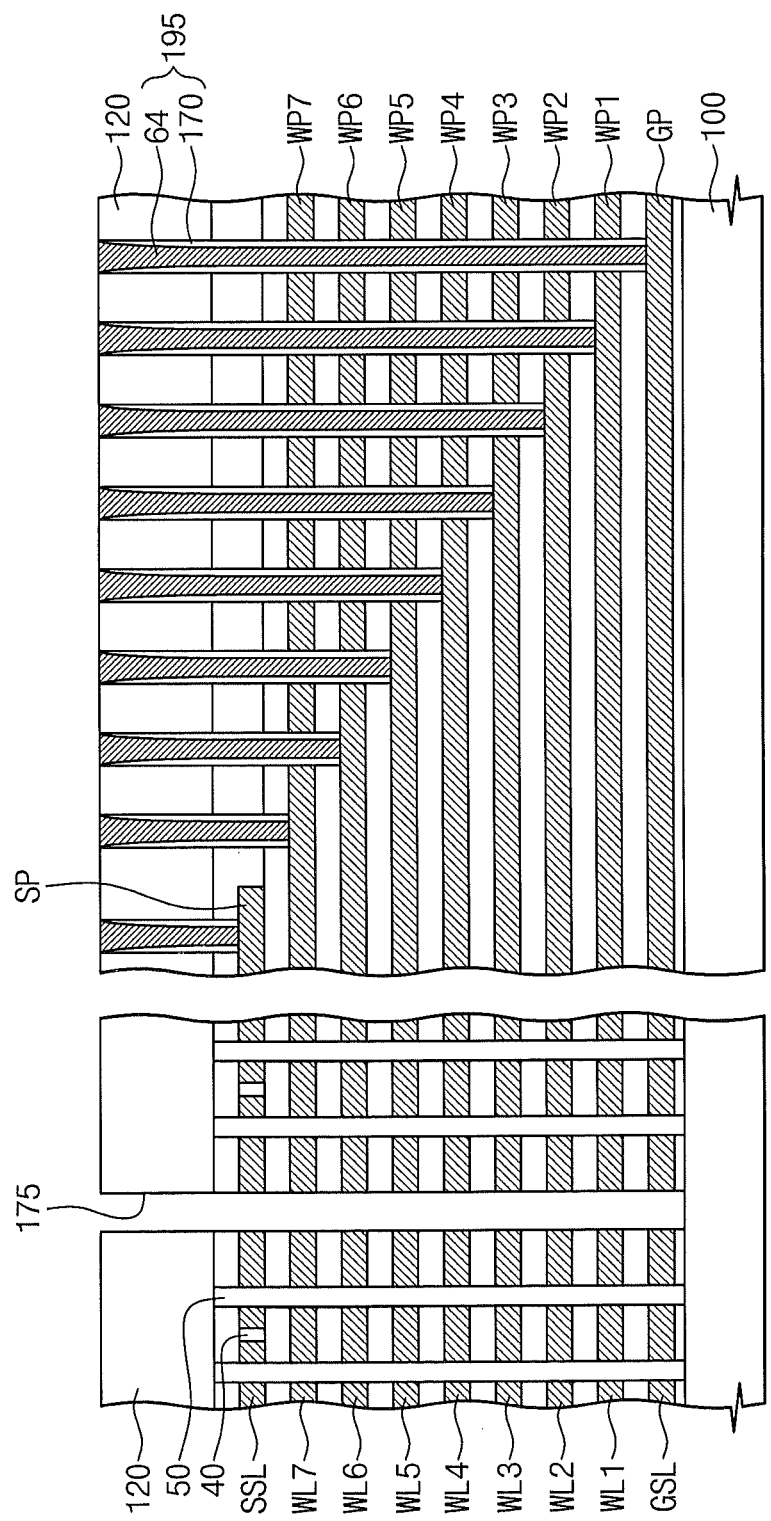

FIGS. 17A and 18A are enlarged plan views of the portion 'A' of FIG. 1 to illustrate operations for manufacturing a semiconductor device according to some embodiments of the inventive subject matter. FIGS. 17B and 18B are cross-sectional views taken along lines I-I' and II-II' of FIGS. 17A and 18A, respectively. FIGS. 19 to 21 are cross-sectional views corresponding to lines I-I' and II-II' of FIG. 17A to illustrate operations for manufacturing a semiconductor device according to some embodiments of the inventive subject matter.

Referring to FIGS. 17A and 17B, a third conductive layer 64 is deposited on the stack 110 described with reference to FIGS. 7A and 7B. The third conductive layer 64 fills the contact holes S1, S2 and CT1 to CT7. The third conductive layer 64 outside the contact holes S1, S2 and CT1 to CT7 is removed using a CMP process, thereby forming plugs 195. The plug 195 may include the third conductive layer 64 and the insulating spacer 170.

Referring to FIGS. 18A and 18B, an isolation trench 175 is formed to penetrate the stack 110. The isolation trench 175 may extend from the cell region 20 into the interconnection region 30 along the D1 direction. The isolation trench 175 may be provided between the vertical channels 50 and between the contact holes S1, S2 and CT1 to CT7. The isolation trench 175 may expose the substrate 100. The isolation trench 175 exposes sidewalls of the plurality of sacrificial layers 300 and sidewalls of the plurality of the insulating layers 200.

Referring to FIGS. 19 and 20, the sacrificial layers 300 exposed by the isolation trench 175 may be removed. The sacrificial layers 300 may be selectively removed using an etching solution having an etch selectivity with respect to the insulating layers 200. For example, the sacrificial layers 300 may be selectively removed using a phosphoric acid solution. A fourth conductive layer 66 is provided on the stack 110 including regions formed by the removal of the sacrificial layers 300 and the contact holes S1, S2 and CT1 to CT7. The fourth conductive layer 66 may include a metal, a metal silicide and/or a semiconductor doped with dopants. The fourth conductive layer 66 is formed using a chemical vapor deposition (CVD) process or an atomic layer deposition (ALD) process. A gate dielectric layer 70 may be formed between the fourth conductive layer 66 and the insulating layers 200, as illustrated in FIG. 12.

Referring to FIG. 21, the exposed fourth conductive layer 66 on the first interlayer dielectric layer 120 is removed. The fourth conductive layer 66 in the isolation trench 175 is removed. Thus, a string selection line SSL, word lines WL1 to WL7 and a ground selection line GSL may be formed in the cell region 20. A string selection line pad SP extending from the string selection line SSL, word line pads WP1 to WP7 extending from the word lines WL1 to WL7, and a ground selection line pad GP extending from the ground selection line GSL may be formed in the interconnection region 30. The string selection line pad SP, the word line pads WP1 to WP7 and the ground selection line pad GP are electrically connected to the plugs 195, respectively.

Figure 22A:
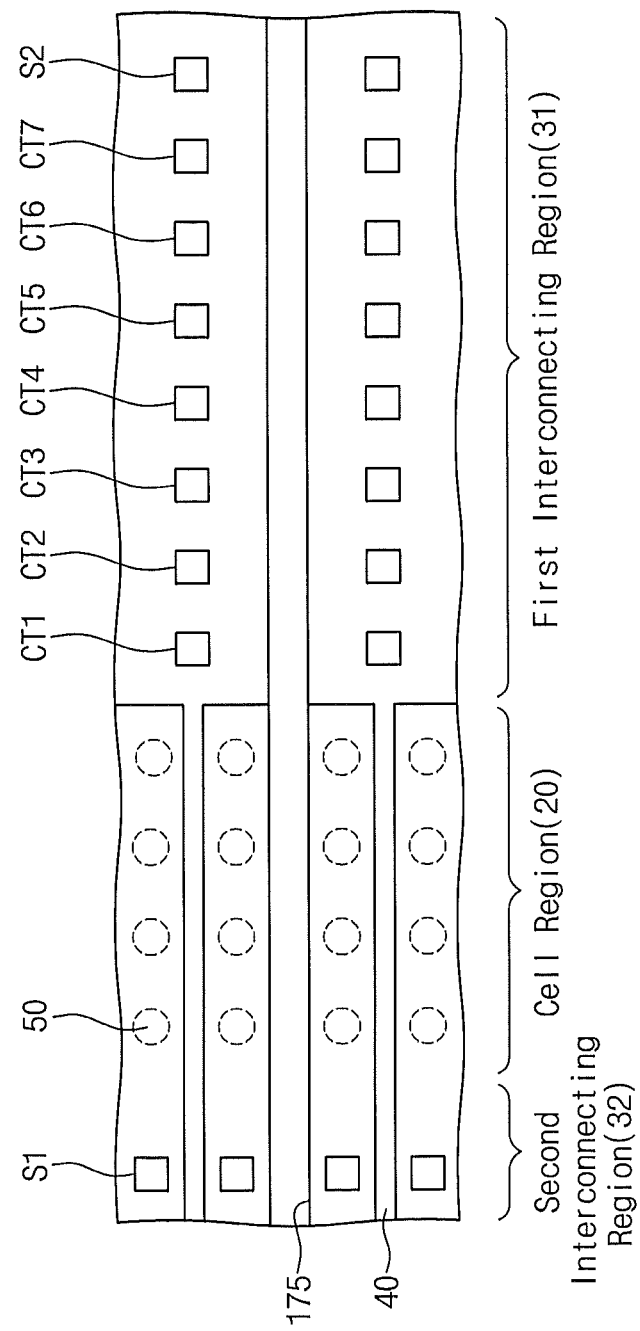
FIGS. 22A, 22B, and 22C are plan views of semiconductor devices according to further embodiments of the inventive subject matter.
Figure 22B:
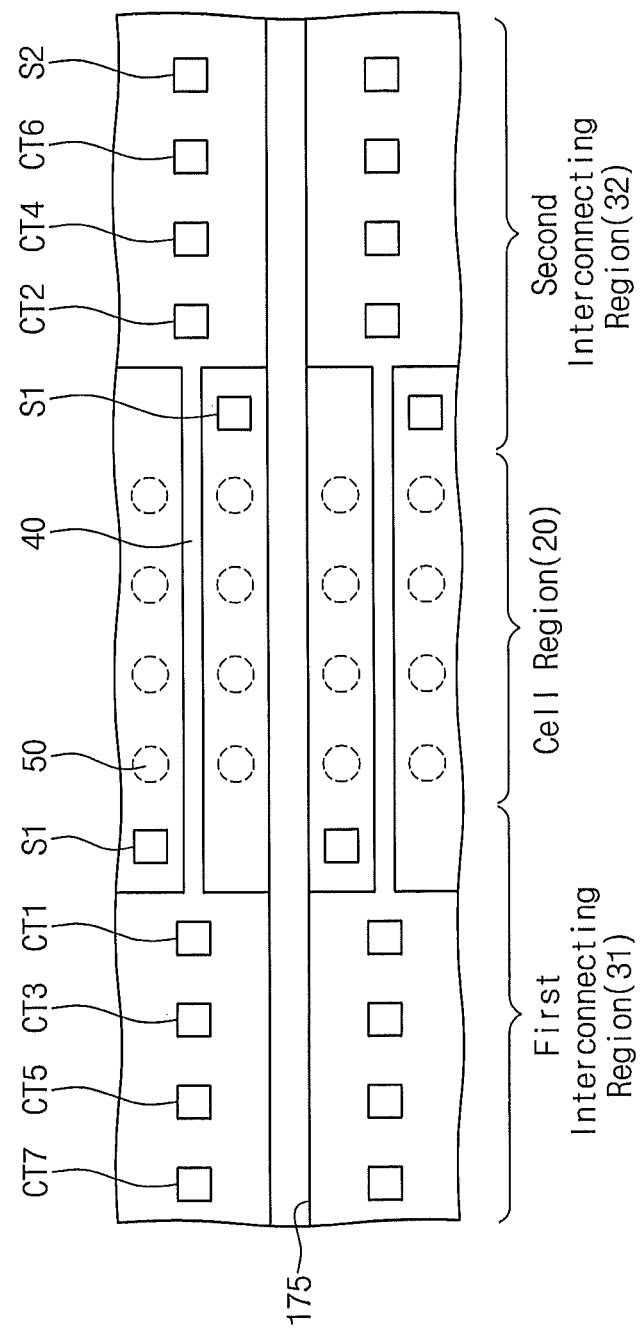
Figure 22C:
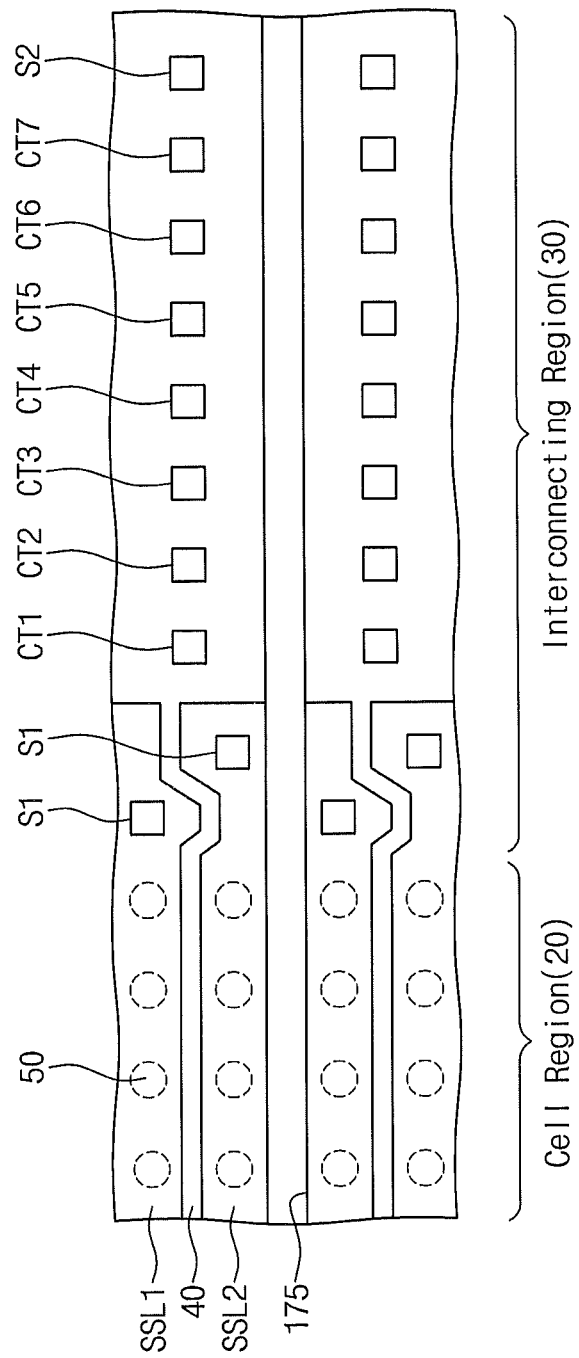

FIGS. 22A, 22B, and 22C are enlarged plan views of the portion 'A' of FIG. 1 to illustrate semiconductor devices according to further embodiments of the inventive subject matter.

Referring to FIG. 22A, an interconnection region may include a first interconnection region 31 and a second interconnection region 32. The first interconnection region 31 may be disposed at one side of the cell region 20, and the second interconnection region 32 may be disposed at another side of the cell region 20. One or some of the contact holes may be disposed in the first interconnection region 31 and the others of the contact holes may be disposed in the second interconnection region 32. For example, the upper selection contact hole S1 may be disposed in the first interconnection region 31, and the word line contact holes CT1 to CT7 and the lower selection contact hole S2 may be disposed in the second interconnection region 32.

Referring to FIG. 22B, first and second interconnection regions 31 and 32 may be disposed symmetrically with respect to the cell region 20. The contact holes S1, S2 and CT1 to CT7 may be disposed symmetrically in the first and second interconnection regions 31 and 32. For example, the first, third fifth and seventh word line contact holes CT1, CT3, CT5 and CT7 may be disposed in the first interconnection regions 31, and the second, fourth and sixth word line contact holes CT2, CT4 and CT6 and the lower selection contact hole S2 may be disposed in the second interconnection region 32. The upper selection contact holes S1 may be alternately disposed in the first and second interconnection regions 31 and 32.

Referring to FIG. 22C, a separation region 40 separates string selection lines SSL1 and SSL2 from each other and separates string selection line pads SP extending from the string selection lines SSL1 and SSL2 from each other. The separation region 40 may be bent in the interconnection region 30. The upper selection contact holes S1 may be disposed to be offset in one direction.

Figure 23:
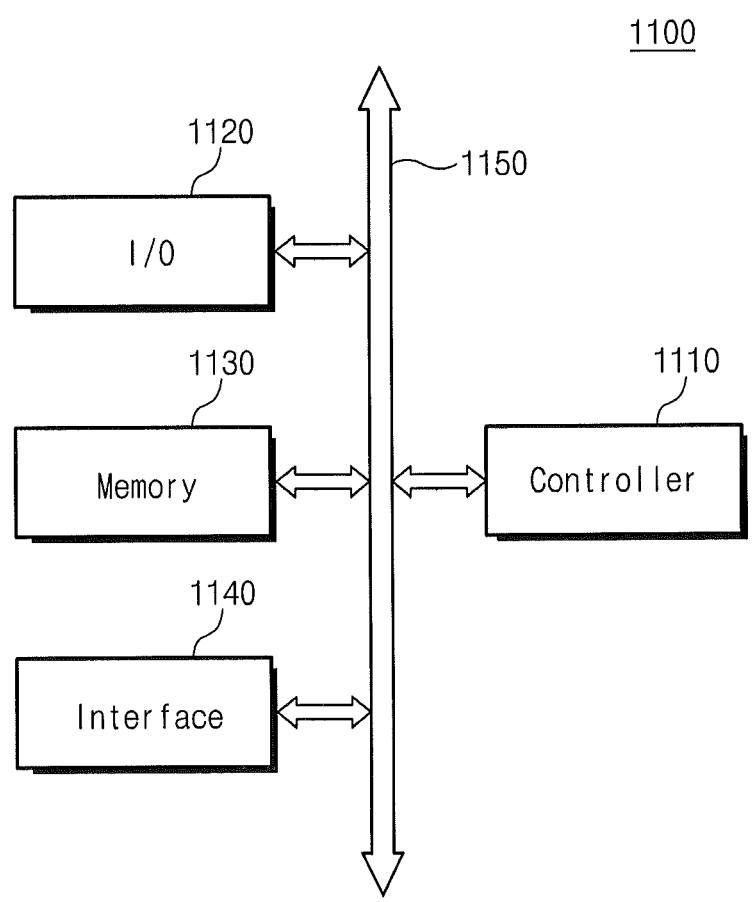
FIG. 23 is a schematic block diagram illustrating an example of memory systems including semiconductor devices according to some embodiments of the inventive subject matter.

FIG. 23 is a schematic block diagram illustrating an example of memory systems including semiconductor devices according to some embodiments of the inventive subject matter.

Referring to FIG. 23, a memory system 1100 may be applied to a personal digital assistant (PDA), a portable computer, a web tablet, a wireless phone, a mobile phone, a digital music player, a memory card, or any device capable of transmitting and/or receiving information in a wireless environment.

The memory system 1100 includes a controller 1110, an input/output (I/O) device 1120, a memory device 1130, an interface unit 1140, and a data bus 1150. The memory device 1130 and the interface unit 1140 communicate with each other the data bus 1150.

The controller 1110 may include at least one of a microprocessor, a digital signal processor, a microcontroller, or other logic devices having a similar function thereof. The memory device 1130 may be used in order to store commands executed by the controller 1110. The I/O device 1120 may receive data or signals from the outside of the memory system 1100 and/or may output data or signals to the outside of the memory system 1100. For example, the I/O unit 1120 may include a keypad, a keyboard and/or a display unit.

The memory device 1130 includes a non-volatile memory device according to embodiments of the inventive subject matter. The memory device 1130 may further include another kind of a memory device, a random access volatile memory device, and/or other various kinds of memory devices.

The interface unit 1140 may transmit electrical data to a communication network or may receive electrical data from a communication network.

Figure 24:
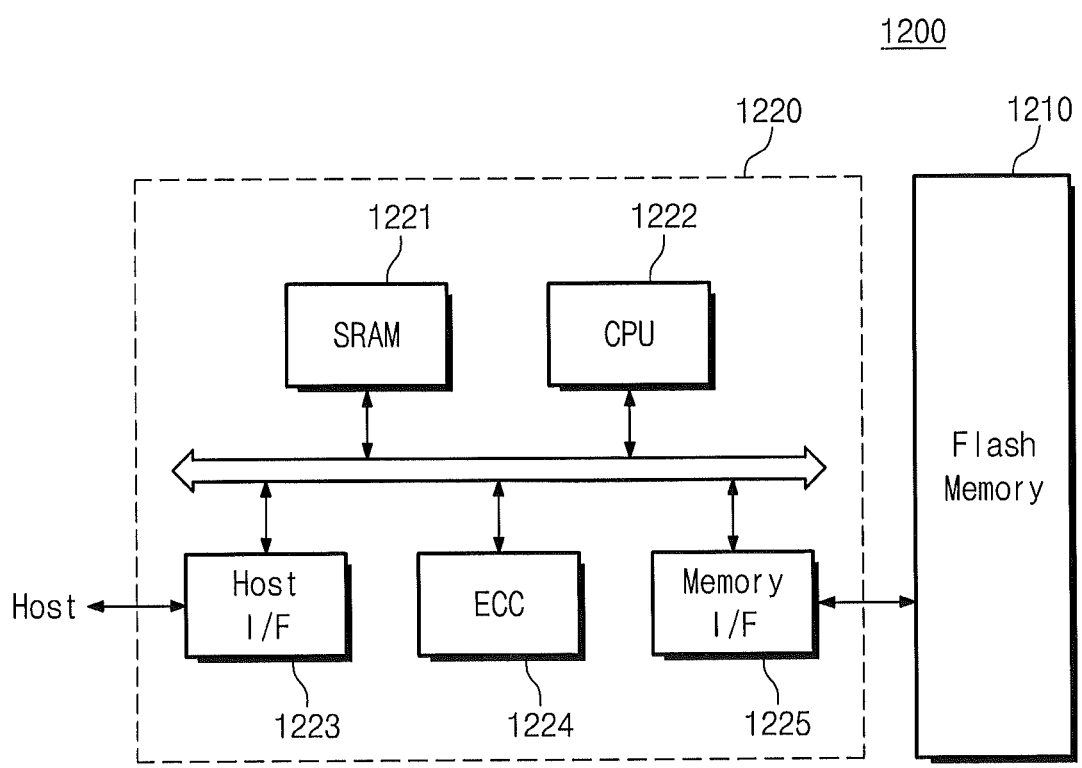
FIG. 24 is a schematic block diagram illustrating an example of memory cards including semiconductor devices according to some embodiments of the inventive subject matter.

FIG. 24 is a schematic block diagram illustrating an example of memory cards including semiconductor devices according to embodiments of the inventive subject matter.

Referring to FIG. 24, a memory card 1200 for supporting massive data storage capacity includes the flash memory device 1210 according to embodiments of the inventive subject matter. The memory card 1200 according to the inventive subject matter includes a memory controller 1220 that controls data communication between a host and the flash memory device 1210.

A static random access memory (SRAM) device 1221 is used as an operation memory of a central processing unit (CPU) 1222. A host interface unit 1223 may be configured to include a data communication protocol between the memory card 1200 and a host. An error check and correction (ECC) block 1224 detects and corrects errors of data which are read out from the memory device 1210. A memory interface unit 1225 may interface with the flash memory device 1210. The CPU 1222 controls overall operations for data exchange of the memory controller 1220. Even though not shown in the drawings, the memory card 1200 according to the inventive subject matter may further include a read only memory (ROM) device that stores code data to interface with the host.

Figure 25:
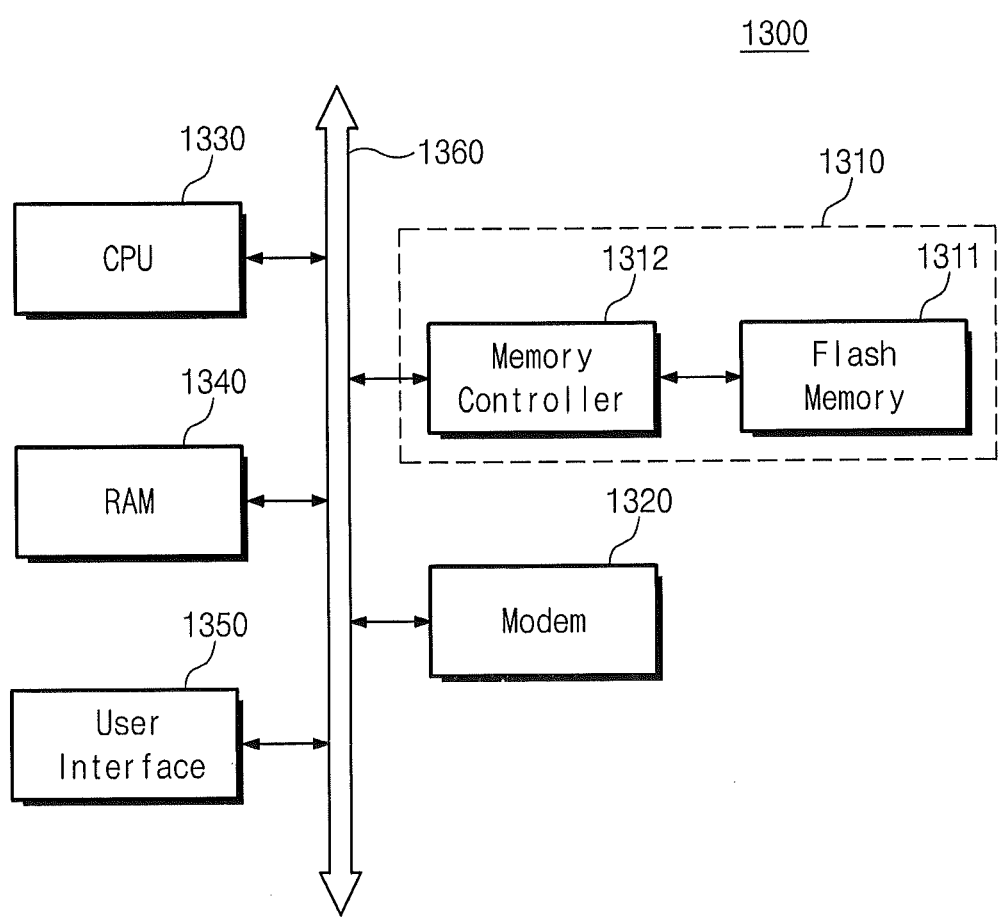
FIG. 25 is a schematic block diagram illustrating an example of information processing systems including semiconductor devices according to some embodiments of the inventive subject matter.

FIG. 25 is a schematic block diagram illustrating an example of information processing systems including semiconductor devices according to embodiments of the inventive subject matter.

Referring to FIG. 25, a flash memory system 1310 according to the inventive subject matter is installed in an information processing system 1300 such as a mobile device or a desk top computer. An information processing system 1300 according to the inventive subject matter may include a modem 1320, a central processing unit (CPU) 1330, a random access memory (RAM) device 1340, and a user interface unit 1350 that are electrically connected to the flash memory system 1310 through a system bus 1360. The flash memory system 1310 may have substantially the same structure as the aforementioned memory system or flash memory system. The flash memory system 1310 may store data processed by the CPU 1330 or data inputted from an external system. The flash memory system 1310 may be realized as a solid state disk (SSD). In this case, the information processing system 1300 may stably and reliably store massive data in the flash memory system 1310. The increase in reliability enables the flash memory system 1310 to conserve resources for error correction, such that a high speed data exchange function may be provided to the information processing system 1300. Although not shown in the drawings, the information processing system 1300 may further include an application chipset, a camera image processor (CIS), and/or an input/output device.

Additionally, the flash memory device or the memory system according to the inventive subject matter may be encapsulated using various packaging techniques. For example, the flash memory device and the memory system according to the inventive subject matter may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

According to embodiments of the inventive subject matter, the area of the interconnection region for electrically connecting the word lines to the peripheral circuit may be reduced in the three-dimensional memory device. Additionally, the patterning processes for the formation of the interconnecting structures may be reduced. Thus, highly integrated and low cost semiconductor devices may be realized.

While the inventive subject matter have been described with reference to example embodiments, it will be apparent to those skilled in the art that various changes and modifications may be made without departing from the spirits and scopes of the inventive subject matter. Therefore, it should be understood that the above embodiments are not limiting, but illustrative. Thus, the scopes of the inventive subject matter are to be determined by the broadest permissible interpretation of the following claims and their equivalents, and shall not be restricted or limited by the foregoing description.

What is claimed is:

1. A semiconductor memory device comprising:
    a substrate including a cell region and an interconnection region;
    adjacent first and second rows of vertical channels extending vertically from the substrate in the cell region;
    layers of word lines stacked on the substrate, each layer including a first word line through which the first row of vertical channels passes and a second word line through which the second row of vertical channels passes, the word lines including respective word line pads extending into the interconnection region;
    an isolation pattern separating the first and second word lines in the cell region and the interconnection region; and
    contact plugs disposed on opposite sides of the isolation pattern in the interconnection region and contacting the word line pads,
    wherein each of the contact plugs comprises a first conductive pattern penetrating at least one of the word line pads and electrically connecting with one word pad disposed below the at least one of the word line pads and a second conductive pattern extending vertically from the one word line pad and surrounding the first conductive pattern.

2. The semiconductor memory device of claim 1, further comprising respective first and second string selection lines disposed on respective ones of the first word lines and the second word lines.

3. The semiconductor memory device of claim 2, further comprising respective ground selection lines underlying the first and second word lines.

4. The semiconductor memory device of claim 1, wherein sidewalls of the word line pads are substantially vertically aligned with each other.

5. The semiconductor memory device of claim 1, wherein heights of bottom surfaces of the plugs decrease with distance from the cell region.

6. The semiconductor memory device of claim 1, wherein a height difference between adjacent ones of the plugs adjacent is substantially equal to a height difference between the word line pads connected thereto.

7. The semiconductor memory device of claim 1, wherein the first conductive pattern and the second conductive pattern include the same material layer as the word lines.

8. The semiconductor memory device of claim 1, wherein each of the plugs further includes an insulating spacer surrounding the second conductive pattern.

9. The semiconductor memory device of claim 8, wherein each insulating spacer separates the associated plug from at least one of the word line pads.

10. The semiconductor memory device of claim 1, wherein a thickness of the word lines is less than a width of the plugs.

11. The semiconductor memory device of claim 1, wherein the first conductive pattern and the second conductive pattern comprise respective different materials.

12. The semiconductor memory device of claim 1, further comprising a gate insulating layer disposed between the vertical channels and the word lines and extending on upper and lower surfaces of the word lines.

* * * * *